(12) United States Patent
Sun et al.

(10) Patent No.: US 12,057,332 B2
(45) Date of Patent: Aug. 6, 2024

(54) WAFER-LEVEL ETCHING METHODS FOR PLANAR PHOTONICS CIRCUITS AND DEVICES

(71) Applicant: Ayar Labs, Inc., San Francisco, CA (US)

(72) Inventors: Chen Sun, Berkeley, CA (US); Roy Edward Meade, Oakland, CA (US); Mark Wade, Berkeley, CA (US); Alexandra Wright, San Francisco, CA (US); Vladimir Stojanovic, Berkeley, CA (US)

(73) Assignee: Ayar Labs, Inc., Santa Clara, CA (US)

( * ) Notice: Subject to any disclaimer, the term of this patent is extended or adjusted under 35 U.S.C. 154(b) by 307 days.

(21) Appl. No.: 15/646,039

(22) Filed: Jul. 10, 2017

(65) Prior Publication Data
US 2018/0019139 A1    Jan. 18, 2018

Related U.S. Application Data

(60) Provisional application No. 62/361,493, filed on Jul. 12, 2016.

(51) Int. Cl.
*H01L 21/304* (2006.01)
*B05D 1/00* (2006.01)
(Continued)

(52) U.S. Cl.
CPC .......... *H01L 21/6715* (2013.01); *B05D 1/005* (2013.01); *G02B 6/12004* (2013.01);
(Continued)

(58) Field of Classification Search
CPC . H01L 21/6715; H01L 21/3043; H01L 21/78; H01S 5/0265; G03F 7/162
See application file for complete search history.

(56) References Cited

U.S. PATENT DOCUMENTS

| 4,374,915 A | 2/1983 | Ahlquist et al. |
| 4,767,724 A | 8/1988 | Kim et al. |

(Continued)

OTHER PUBLICATIONS

International Search Report and Written Opinion, PCT/US17/41604, Dated Nov. 21, 2017, 10 pages.
(Continued)

*Primary Examiner* — Thomas T Pham
(74) *Attorney, Agent, or Firm* — Penilla IP, APC

(57) ABSTRACT

A photoresist material is deposited, patterned, and developed on a backside of a wafer to expose specific regions on the backside of chips for etching. These specific regions are etched to form etched regions through the backside of the chips to a specified depth within the chips. The specified depth may correspond to an etch stop material. Etching of the backside of the wafer can also be done along the chip kerf regions to reduce stress during singulation/dicing of individual chips from the wafer. Etching of the backside of the chips can be done with the chips still part of the intact wafer. Or, the wafer having the pattered and developed photoresist on its backside can be singulated/diced before etching through the backside of the individual chips. The etched region(s) formed through the backside of a chip can be used for attachment of optical component(s) to the chip.

48 Claims, 17 Drawing Sheets

(51) Int. Cl.
*G02B 6/12* (2006.01)
*G02B 6/122* (2006.01)
*G02B 6/36* (2006.01)
*G03F 7/16* (2006.01)
*G03F 9/00* (2006.01)
*H01L 21/67* (2006.01)
*H01S 5/026* (2006.01)

(52) U.S. Cl.
CPC ......... *G02B 6/1225* (2013.01); *G02B 6/3692* (2013.01); *G03F 7/162* (2013.01); *G03F 9/708* (2013.01); *G03F 9/7084* (2013.01); *H01S 5/0265* (2013.01); *G02B 2006/12061* (2013.01)

(56) References Cited

U.S. PATENT DOCUMENTS

| | | | |
|---|---|---|---|
| 5,937,274 A * | 8/1999 | Kondow | H01L 21/02392 |
| | | | 438/47 |
| 6,521,513 B1 * | 2/2003 | Lebens | B81C 1/00873 |
| | | | 257/620 |
| 6,555,441 B2 | 4/2003 | Ouellet | |
| 6,902,986 B2 | 6/2005 | Maltabes et al. | |
| 7,454,102 B2 | 11/2008 | Keyser et al. | |
| 7,507,638 B2 * | 3/2009 | Mancini | H01L 21/3065 |
| | | | 257/E21.214 |
| 7,823,216 B2 | 10/2010 | Fan et al. | |
| 7,920,770 B2 | 4/2011 | Holzwarth et al. | |
| 9,780,484 B2 * | 10/2017 | DiFonzo | H01R 43/26 |
| 2001/0012593 A1 | 8/2001 | Chang et al. | |
| 2004/0142256 A1 | 7/2004 | Best et al. | |
| 2004/0266202 A1 | 12/2004 | Bandy et al. | |
| 2005/0284181 A1 | 12/2005 | Smith et al. | |
| 2006/0024923 A1 * | 2/2006 | Sarma | H01L 23/544 |
| | | | 438/462 |
| 2006/0226118 A1 | 10/2006 | Baluswamy et al. | |
| 2007/0253663 A1 | 11/2007 | Keyser et al. | |
| 2008/0067421 A1 * | 3/2008 | Cheng | B82Y 10/00 |
| | | | 250/492.1 |
| 2009/0274418 A1 | 11/2009 | Holzwarth et al. | |
| 2011/0149062 A1 * | 6/2011 | Campidell | G01J 5/02 |
| | | | 348/87 |
| 2012/0130300 A1 * | 5/2012 | Stavchansky | A61F 2/82 |
| | | | 604/8 |
| 2013/0230273 A1 * | 9/2013 | Doscher | H01L 23/544 |
| | | | 385/14 |
| 2014/0368804 A1 | 12/2014 | Lafarre et al. | |
| 2016/0003975 A1 * | 1/2016 | Salo | G01W 1/08 |
| | | | 73/170.28 |
| 2017/0005062 A1 * | 1/2017 | Azuma | C09J 7/38 |

OTHER PUBLICATIONS

Chen Sun et al., "Single-Chip Microprocessor that Communicates Directly Using Light," Nature, 2015.
C. Holzwarth et al., "Localized Substrate Removal Technique Enabling Strong-Confinement Microphotonics in Bulk Si CMOS Processes," Conference on Lasers and Electro-Optics, Optical Society of America, 2008.
J. Orcutt et al., "Nanophotonic Integration in State-of-the-Art CMOS Foundries," Optics Express 19.3 (2011):2335-2346.
G. Li et al., "Ultralow-Power High-Performance Si Photonic Transmitter," Optical Fiber Communication Conference, Optical Society of America, 2010.
Klaus Reimer et al., "Micro-Optic Fabrication Using One-Level Gray-Tone Lithography," Proc. SPIE vol. 3008, p. 279-288: Miniaturized Systems with Microoptics and Micromechanics II, San Jose, 1997.

* cited by examiner

WAFER-LEVEL ETCHING METHODS FOR PLANAR PHOTONICS CIRCUITS AND DEVICES

CLAIM OF PRIORITY

This application claims priority under 35 U.S.C. 119(e) to U.S. Provisional Patent Application No. 62/361,493, filed Jul. 12, 2016, the disclosure of which is incorporated herein by reference in its entirety for all purposes.

BACKGROUND

1. Field of the Invention

The present invention relates to fiber-optic data communication.

2. Description of the Related Art

Implementation of planar photonics circuits on a semiconductor chip requires attachment of one or more photonic device(s) to the semiconductor chip. Also, the photonics device should be accurately aligned to the chip so that light signals can be transmitted correctly between the photonics device and the semiconductor chip. It is within this context that the present invention arises.

SUMMARY

In an example embodiment, a method is disclosed for processing a semiconductor wafer to enable alignment of the semiconductor wafer from a backside of the semiconductor wafer. The method includes applying a photoresist material to the backside of the semiconductor wafer. The method also includes exposing particular regions of the backside of the semiconductor wafer through the photoresist material. The method also includes etching the backside of the semiconductor wafer at the particular regions to form alignment features within the backside of the semiconductor wafer.

In an example embodiment, a method is disclosed for processing a backside of a semiconductor chip. The method includes applying a photoresist material to a backside of a semiconductor wafer including a plurality of semiconductor chips. The method also includes exposing particular regions of the backside of the semiconductor wafer through the photoresist material. The particular regions collectively include a portion of a backside of each of the plurality of semiconductor chips. The method also includes etching the backside of the semiconductor wafer at the particular regions with the semiconductor wafer in an intact state. The method also includes singulating the semiconductor wafer to obtain the plurality of semiconductor chips in individual form, where the backside of each of the plurality of semiconductor chips includes an etched region corresponding to at least a portion of at least one of the particular regions.

In an example embodiment, a method is disclosed for processing a backside of a semiconductor chip. The method includes applying a photoresist material to a backside of a semiconductor wafer including a plurality of semiconductor chips. The method also includes exposing particular regions of the backside of the semiconductor wafer through the photoresist material. The particular regions collectively include a portion of a backside of each of the plurality of semiconductor chips. The method also includes singulating the semiconductor wafer to obtain the plurality of semiconductor chips in individual form. The method also includes etching the backside of each of the plurality of semiconductor chips in individual form at the particular regions, such that the backside of each of the plurality of semiconductor chips includes an etched region corresponding to at least a portion of at least one of the particular regions.

Other aspects and advantages of the invention will become more apparent from the following detailed description, taken in conjunction with the accompanying drawings, illustrating by way of example the present invention.

DETAILED DESCRIPTION

Figure 1A:
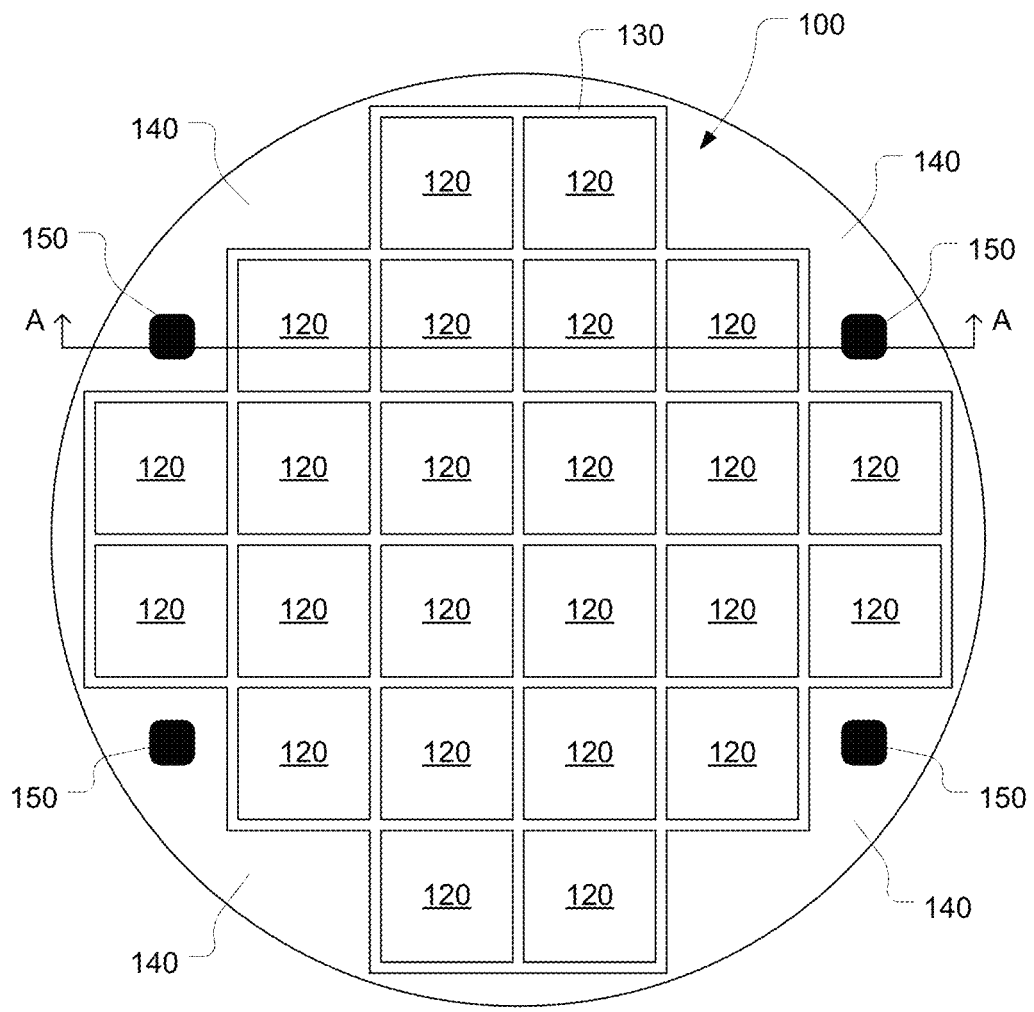
FIG. 1A shows a view of an example wafer from a front side of the wafer, in accordance with some embodiments of the present invention.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Methods are disclosed herein for removing specific portions/regions/areas of semiconductor chips manufactured through semiconductor wafer-level processing to enable and/or optimize planar photonics circuits and devices present on those chips. Also, semiconductor chips are disclosed herein that result from these methods.

Implementation of planar photonics circuits on a semiconductor chip can be assisted/enabled through strategic removal of portions of a substrate, e.g., silicon substrate, of the semiconductor chip. For example, removal of specific portions of the silicon handle structure present on thin-BOX SOI chips (thin-buried-oxide (BOX) silicon-on-insulator (SOI) chips) and/or bulk CMOS chips (complementary metal-oxide-semiconductor (CMOS) chips) can be done to enable implementation of photonics devices on those chips, while also providing improved thermal isolation properties for thermal-optic devices on those chips, and while also providing optical access through the backside of those chips. For ease of description, the term "chip" is used hereafter to refer to any type of semiconductor chip, including thin-BOX SOI chips, thick-BOX SOI chips, and/or bulk CMOS chips, among other types of semiconductor chips. Also, for ease of description, the term "wafer" is used hereafter to refer to any type of semiconductor wafer upon which chips are manufactured. It should be understood that in various embodiments the wafer can include different numbers of chips.

Removal of specific portions of the silicon substrate of the chip to enable implementation of on-chip planar photonics circuits can be difficult and may cause damage to the chip if not done properly. It is possible to remove specific portions of the silicon substrate of the chip on a chip-by-chip basis, i.e., after dicing/singulating of the individual chips from an intact wafer. However, when portions of the silicon substrate of the chip are removed on a chip-by-chip basis, chip alignment tolerances and etch feature locations used for removal of the portions of the silicon substrate are on the order of one hundred microns or greater. Additionally, when portions of the silicon substrate of the chip are removed on a chip-by-chip basis, as opposed to on the intact wafer basis, resulting chip yield and etch process control can be limited.

In some embodiments, in the interest of improving chip fabrication processes and chip yield, consideration is given to removing specified portions of the silicon substrate of the chip while the chip is still part of the intact wafer, as opposed to first singulating the chip from the wafer before removing the required portions of the silicon substrate from the individual chips on a chip-by-chip basis. In order to remove the specified portions of the silicon substrate of the chip while the chip is still part of the intact wafer, it is necessary to address issues associated with the resulting mechanical integrity, i.e., fragility, of the wafer caused by removal of those portions of the silicon substrate from the multiple chips across the wafer.

Wafer-level processing to remove specified portions of the silicon substrate of the chips while the chips are still part of the intact wafer provides for potentially better etch alignment and feature definition than what is achievable through processing of individual chips after they are singulated from the wafer. Also, a combination of wafer-level patterning/etching and package-level etching provides for precise removal of the specified portions of the silicon substrate of the chips without compromising the mechanical robustness of the chips during the packaging process. It should be understood that in some embodiments an amount of etching can be performed on the backside of the dies and/or non-die portions of the wafer at the wafer-level, i.e., before dicing/singulating of the individual dies from the wafer, and an amount of etching can be performed on the backside of the dies and/or die packaging at the package-level, i.e., after dicing/singulating of the individual dies from the wafer and/or after packaging of the individual dies. Also, the combination of wafer-level patterning/etching and package-level etching provides for definition of features on the chips that enhance the precision of optical fiber attachments to the chips during packaging. Additionally, wafer-level backside substrate etching of thin-BOX SOI wafers can further enable integration of III-V gain chips to achieve gain and laser elements that are tightly integrated with underlying silicon-photonic components and/or electronic circuits for sensing, communication, and/or laser control.

In some embodiments, wafer-level handling and processing techniques and processing steps for etching specific portions of wafers are provided to enable and/or optimize implementation of photonic devices and circuits within the chips present on the wafer undergoing processing. For example, wafer-level substrate etching lowers the loss of silicon or poly-Si waveguides, or inductors defined on the chip. Although post-process etching can be done on an individual chip-by-chip basis, wafer-level processing allows these steps to be done at far higher throughput and at lower costs. In order to define the features for removal, i.e., the specific portions of the wafer substrate to be removed through the wafer-level backside etching process, methods are disclosed for exposing alignment markers from the wafer backside to enable alignment of the wafer to the lithographic tool from the backside of the wafer. These methods enable formation of finer, i.e., smaller and more precise, backside feature structures using standard wafer processing tools.

After wafer backside alignment, masking, and etching, the resulting etched features may degrade the structural integrity of the wafer so as to weaken the wafer and cause the weakened wafer to fracture or crack during dicing and chip singulation and/or packaging. Methods are disclosed herein for removing the substrate or silicon handle of a silicon-on-insulator (SOI) wafer to increase the yield of singulated chips. In addition, methods are described herein in which the wafer backside etch features are defined at wafer-level while the etching step itself is done on singulated dies or even packaged dies. Also, methods are disclosed herein for adding the III-V material die to the bottom of the etched trench at wafer-level, defined with thin-BOX SOI or shallow-trench isolation oxide, to form optical amplifiers and lasers. Additionally, this III-V material die is connected to the metal interconnects on the wafer through a substrate tap or a buried interface tie (BITIE), forming a low-resistivity electrical connection.

During typical wafer-level processing, each lithographic layer must be aligned to a prior layer. The many features, including alignment fiducials, that are created on the frontside of a wafer enable alignment from the front side. By contrast, the backside of the wafer remains completely featureless, which causes difficulty with lithographic alignment and patterning of aligned features on the backside of the wafer. In an example embodiment, a method is disclosed for alignment of the backside of the wafer. The method includes a first optional step of subjecting the backside of the wafer to one or more processes of backgrinding, polishing, polygrinding, chemical mechanical polishing (CMP), and/or lapping, among others, to thin the wafer handle present on the backside of the wafer, thereby reducing the time required to etch through the remaining material on the backside of the wafer during subsequent processing steps. Thinning of the material present on the backside of the wafer also aids in controlling the amount of etched area and increasing accuracy of the etch, particularly in the case of an isotropic etchant.

The method proceeds with an etching step to remove a small region of the wafer handle substrate, from the backside of the wafer, in order to expose one or more frontside features of the wafer. It should be understood that "frontside features" of the wafer may be present within the wafer, i.e., inside of the thickness of the wafer, at a location between the wafer handle and the top surface of the wafer. Due to wafers typically being circular and chips typically being rectangular, a wafer usually contains some unusable areas close to the outer radial perimeter of the wafer where only a part of an individual chip can be formed. While features of the partially formed chips in this area cannot be used to yield working chips, they remain useful for alignment. The small region of the wafer handle substrate removed in the etching step can be located in these unusable areas so as to expose frontside features of the wafer without having to sacrifice useful wafer area. Also, the etching step for removing the small region of the wafer handle substrate from the unusable area of the wafer can be done as a coarse etching process.

Creation of the wafer backside etching pattern can be done using standard lithographic steps, such as spin-coating of photoresist on the backside of the wafer, soft baking of the photoresist, exposure of the photoresist through a reticle to an appropriate wavelength of light to pattern the regions for etching, develop of the photoresist, and hard baking of the photoresist, among other possible steps. Once the photoresist is patterned as needed to expose the regions for etching on the backside of the wafer, the etching process can be performed on and through the backside of the wafer. In the etching process, the etchant can be anything that is capable of etching the material that makes up the substrate handle of the wafer (e.g., crystalline silicon), and that is preferably selective to the material that makes up the substrate handle of the wafer relative to other surrounding materials.

In some embodiments, etchant with high selectivity relative to oxides, such as $SF_6$, $XeF_2$, TMAH, or KOH are preferable as they can be easily controlled to stop on an oxide layer. For an SOI wafer, these types of etchants can be used to stop the wafer backside etch on the buried oxide (BOX) layer within the wafer. For a bulk CMOS wafer, these etchants can be used to stop the wafer backside etch on a shallow trench isolation (STI) region material within the wafer. In some embodiments in which the etchant is not highly selective or in which the wafer backside etch proceeds through oxide material, features located within the metal stack of the wafer, i.e., within the metal interconnect levels of the wafer, may be etched to and exposed for use in alignment of the wafer.

Figure 1B:
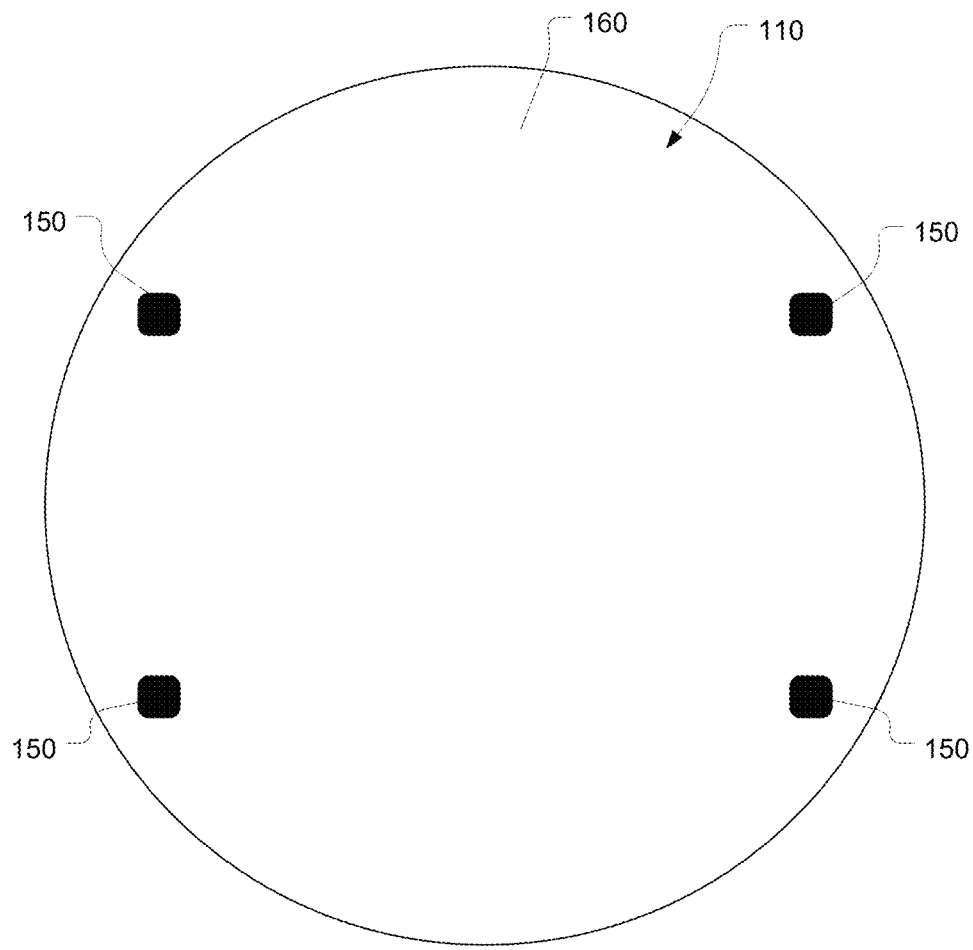
FIG. 1B shows a view of the wafer of FIG. 1A from a back side of the wafer, in accordance with some embodiments of the present invention.
Figure 1C:
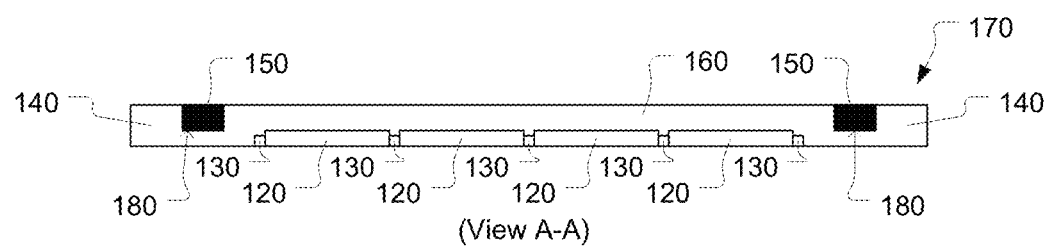
FIG. 1C shows a view of a cross-section of the wafer of FIG. 1A with the back side of the wafer facing up, in accordance with some embodiments of the present invention.

FIG. 1A shows a view of an example wafer from a front side 100 of the wafer, in accordance with some embodiments of the present invention. FIG. 1B shows a view of the wafer of FIG. 1A from a back side 110 of the wafer, in accordance with some embodiments of the present invention. FIG. 1C shows a view of a cross-section 170 (referenced as View A-A in FIG. 1A) of the wafer with the back side 110 of the wafer facing up, in accordance with some embodiments of the present invention.

A number of patterned chips 120 are visible from the front side 100 of the wafer, as shown in FIG. 1A, but are not visible from the back side 110, as shown in FIG. 1B. As shown in FIGS. 1A and 1C, chip kerf regions 130, i.e., dicing channels, are formed between the patterned chips 120. FIG. 1A shows unused wafer area 140 that may contain a number of partially formed chips. As previously mentioned, backside etched regions 150 are etched into the wafer handle substrate 160 from the back side 110 of the wafer within the unused wafer area 140. Each etched region 150 essentially defines a hole extending into the back side 110 of the wafer that reveals one or more frontside features within the wafer, such that the revealed frontside feature(s) are visible through the etched regions 150 from the back side 110 of the wafer. In the example of FIG. 1C, the etched regions 150 are etched into the wafer handle substrate 160 from the back side 110 of the wafer to an etch-stop at a dielectric layer 180. However, it should be understood that in various embodiments, the etched regions 150 can extend into the wafer handle substrate 160 from the back side 110 of the wafer to an etch-stop location that is formed by essentially any appropriate type of etch stop material for the etchant being used and/or that is otherwise identifiable to trigger a stop of the etching process. It should be noted that the unused wafer area 140 protects the patterned chips 120 in the case of an isotropic etch in which the etchant may attack/etch the wafer from the sides of the wafer.

In some embodiments, as an alternative to etching through the backside of the wafer to expose features for use in wafer alignment, frontside features may also be directly observed from the backside of the wafer without etching. For example, because crystalline-silicon is transparent to infrared wavelengths (greater than 1100 nanometers), a light source that produces infrared light (such as a simple incandescent bulb) could be used in conjunction with an infrared camera to see through the crystalline-silicon handle on the backside of the wafer to observe frontside features from the backside of the wafer. The infrared camera may require a filter (to filter out unwanted wavelengths of light) in order to accept/detect only infrared wavelengths, if the infrared source is broadband (such as an incandescent bulb), or if there is light contamination from other sources.

Figure 2:
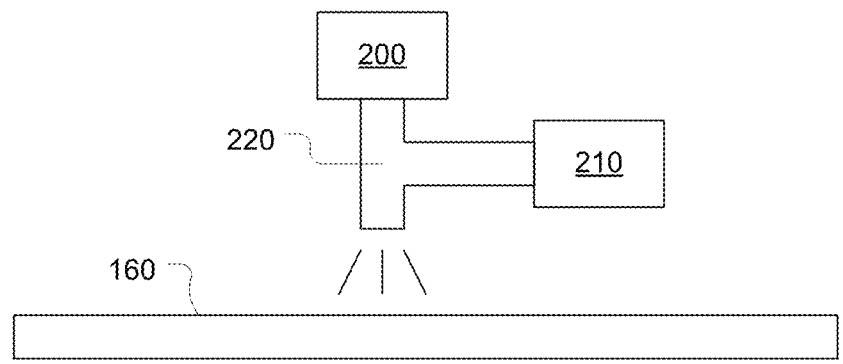
FIG. 2 shows an infrared imaging system that can be used to observe frontside features within the wafer from the back side of the wafer to enable alignment of the wafer, in accordance with some embodiments of the present invention.

FIG. 2 shows an infrared imaging system that can be used to observe frontside features within the wafer from the back side of the wafer to enable alignment of the wafer, in accordance with some embodiments of the present invention. The infrared imaging system includes an infrared camera 200, an infrared light source 210, and a lensing system 220. The lensing system 220 is used to focus the infrared light source 210 and the infrared camera 200. The infrared imaging system can also include an optical filter for rejecting non-infrared wavelengths of light.

In some embodiments, as another alternative to etching through the backside of the wafer to expose features for use in wafer alignment, an aligned front-back camera system can be used for wafer alignment. The front-back camera wafer alignment tolerances will be limited by the mechanics of the front-back camera system.

After achieving backside alignment of the wafer, the backside of the wafer can be accurately patterned to form features within the backside of the wafer that are needed for implementation of photonic devices and circuits within the chips on the wafer. To do this, one can apply standard lithography steps to define features to be etched, where the standard lithography steps can include spin on of photoresist, soft bake of photoresist, exposure of the photoresist to patterned light through a reticle, development of the photoresist, and hard bake of the photoresist, among other steps.

Once the backside of the wafer is appropriately patterned with photoresist, the backside of the wafer is subjected to an etching process using an appropriate etchant to remove portions of the wafer substrate handle 160 at locations where it is exposed through the patterned photoresist. In some embodiments in which the wafer substrate handle 160 is formed of crystalline-silicon, an etchant with high selectivity towards silicon dioxide, such as $SF_6$, $XeF_2$, TMAH, or KOH, can be used to etch away the exposed crystalline-silicon of the wafer substrate handle all the way to the oxide (STI in bulk CMOS wafers or BOX in SOI wafers).

In some embodiments, etching through the backside of the wafer continues until a thin film is left at the etching locations, where the thin film includes interconnect layers and/or front-end layers. Therefore, after the etching, the wafer is subject to cracking or fracture during subsequent wafer dicing and singulation processes due to the high amount of mechanical stress experienced by the wafer during those processes. In some embodiments, in order to manage the mechanical stress imparted to the wafer during dicing and singulation processes, the above-described backside patterning and etching process can be used to pre-etch the chip kerf regions 130 so as to expose the kerf region fiducials that guide the dicing blade. Backside etching of the chip kerf regions 130 can be performed together with the main backside etch step. Wafer dicing techniques such as stealth dicing can also be used to minimize the amount of mechanical stress on the wafer.

For photonic applications, the etched features, i.e., holes, in the backside of the wafer can be filled with a material having a low refractive index and/or low thermal conductivity. In such applications, it may be acceptable to backfill the etched features to provide structural support for the wafer and to redistribute stress fields localized around the etched areas. Such backfilling can help the wafer survive dicing/singulation of chips from the wafer and can help the singulated chips survive subsequent packaging steps. In some embodiments, the backfilling of the etched features can be accomplished by spinning on dielectric material into the etched features, with the spun-on dielectric material self-leveling to fill the etched features. Also, the coefficient of thermal expansion of the backfill material should be sufficiently close to the coefficient of thermal expansion of the surrounding material into which the etched features are formed in order to avoid temperature-induced stress due to differential thermal expansion. For example, if the wafer substrate handle material in crystalline-silicon, then the backfill material should have a coefficient of thermal expansion substantially close to that of crystalline-silicon.

Additionally, for photonic applications, either partial or full patterning of the backside of the wafer can be used to define the features for attachment of optical fibers to the chips. In some embodiments, the optical fibers can be laid directly in etched trenches on the backside of the wafer. In other embodiments, a glass block optical fiber carrier can be aligned to the packaged chip surface.

Also, in some embodiments, before backfilling of the etched features on the backside of the wafer, additional materials or dies can be placed in the etched features to achieve electro-optic functionality not readily available in the bulk-Si wafer or SOI wafer. For example, a III-V material die can be placed on STI or thin-BOX over a grating structure or cavity defined in the poly-Si or body-Si layer of the silicon wafer, so as to form a laser. An optical amplifier can be formed in a similar manner by running an optical waveguide underneath the III-V gain chip. The electrical contacts for the III-V die can be formed either through back-metal deposition and backside wire-bonding or through contact with substrate taps or BITIE contacts, which connect the III-V die structure electrically to the interconnect layers on the wafer. This arrangement is particularly convenient for flip-chip packaging since all the electrical connectivity happens at the frontside of the wafer. After the structure formation, the trench can be backfilled to avoid/manage additional mechanical stress as described previously.

In some embodiments, the wafer backside etching can be done on the individual chips after they are singulated from the wafer. For example, the photoresist can be applied to the backside of the intact wafer, and exposed, developed, and baked to define the backside etching areas and/or dicing channels, with the actual etching postponed. Then, with the patterned photoresist on the backside of the wafer, the wafer is diced/singulated to obtain individual chips from the wafer. Then, the individual chips with the patterned photoresist on their backside are processed through a packaging assembly and etching process after the packaging. Then, the individual chips with the patterned photoresist on their backside are subjected to the etching process, e.g., placed into an etching device and etched to oxide or to a prescribed etch stop location/layer. It should be appreciated that in this embodiment the wafer maintains its full structural integrity going into the dicing/singulation step because the etching of the backside of the wafer is not done prior to dicing/singulation. Also, it should be appreciated that no alignment of the individual chips is needed for the post-singulation etching process because the patterned photoresist on the backside of the individual chips is properly positioned on the individual chips when the chips are part of the intact wafer. In some embodiments, because the dicing/singulation process can be dirty and potentially introduce a number of contaminants, the singulated individual chips can be plasma ashed and cleaned prior to the etching step. In some embodiments, the etched features in the backside of the individual chips can be filled with dielectric material to improve mechanical rigidity and integrity. Also, in some embodiments, the etched features in the backside of the individual chips can be used for optical fiber alignment prior to curing and/or backfilling.

Figure 3A:
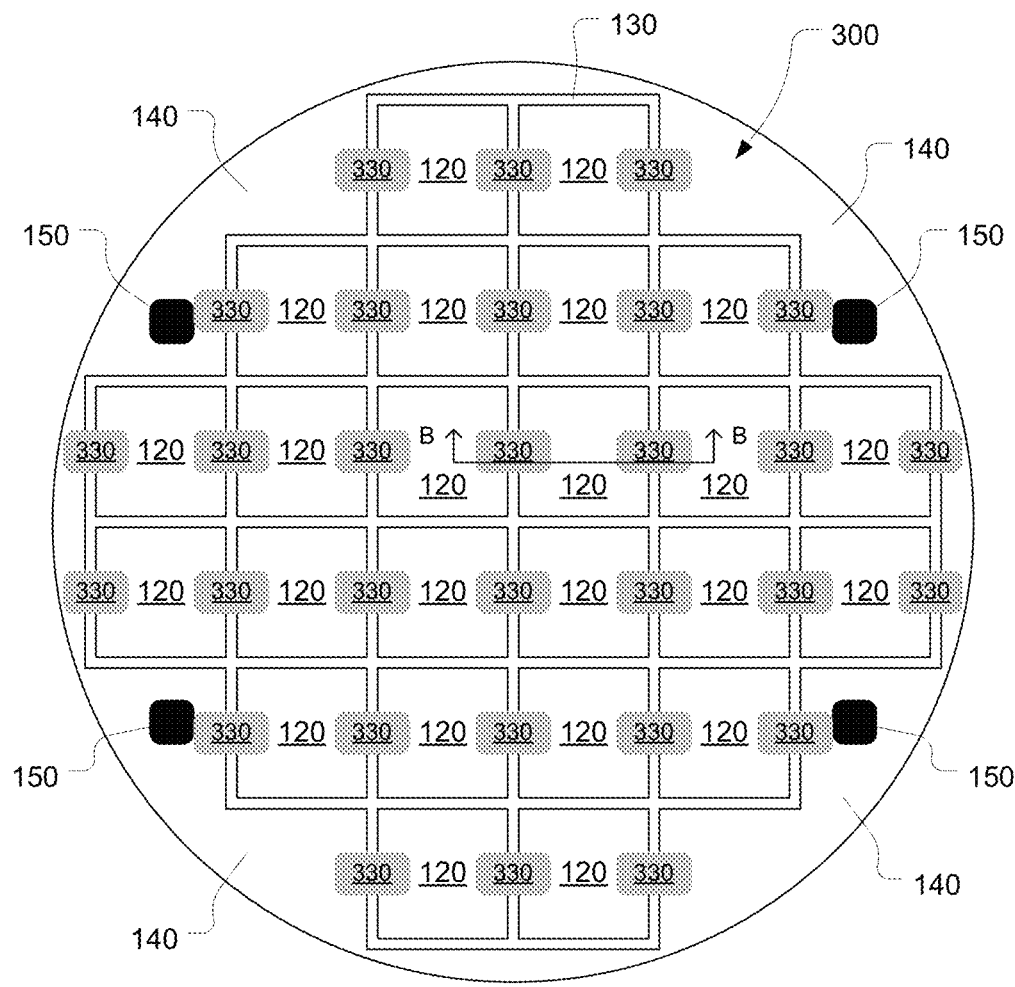
FIG. 3A shows a frontside view of the wafer with the "cliff" configuration, in accordance with some embodiments of the present invention.
Figure 3B:
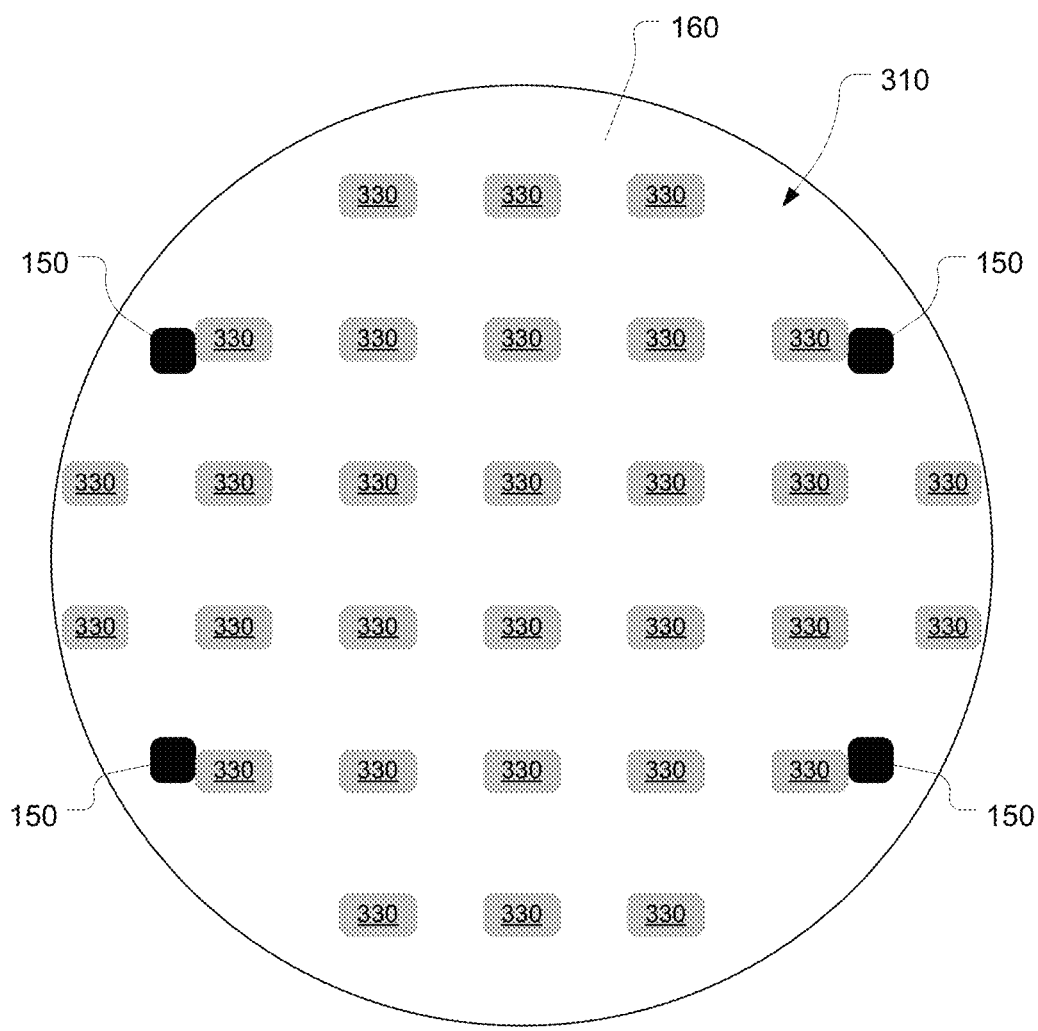
FIG. 3B shows a backside view of the wafer with the "cliff" configuration, in accordance with some embodiments of the present invention.
Figure 3C:
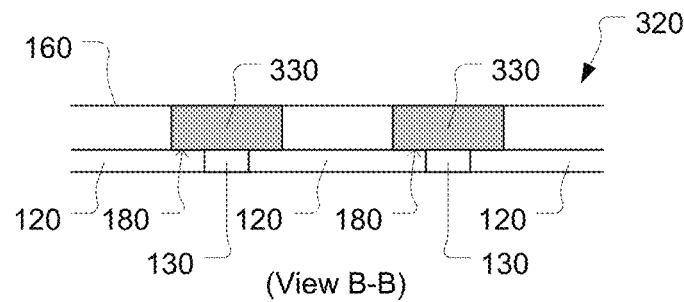
FIG. 3C shows a cross-section view through the wafer with the "cliff" configuration with the backside of the wafer facing upward, in accordance with some embodiments of the present invention.

In some embodiments, a given etched region on the backside of the wafer can take the shape of a "cliff," in which the given etched region extends into the chip kerf region(s) 130. For example, FIGS. 3A-3C show a wafer on which features are etched through the backside of the wafer in a "cliff" configuration. FIG. 3A shows a frontside view 300 of the wafer with the "cliff" configuration, in accordance with some embodiments of the present invention. FIG. 3B shows a backside view 310 of the wafer with the "cliff" configuration, in accordance with some embodiments of the present invention. FIG. 3C shows a cross-section view 320 (reference as View B-B in FIG. 3A) through the wafer with the "cliff" configuration with the backside of the wafer facing upward, in accordance with some embodiments of the present invention. The "cliff" shaped etch features 330 are etched through the backside of the wafer to an etch stop location. In some embodiments, such as shown in FIG. 3C, the "cliff" shaped etch features 330 stop at a dielectric layer 180 within the wafer. However, in other embodiments, the "cliff" shaped features can be defined to stop at any given position and/or material layer within the wafer. Each "cliff" shaped etch feature extends from a location on the backside of a given chip 120 to the edge of the given chip 120, and over the wafer dicing channel 130 to a location either on the backside of an adjacent chip 120 or within the unused region 140 near the periphery of the wafer. In some embodiments, the "cliff" shaped etch features can be backfilled with a dielectric material and planarized following the backside etching process in a manner such as previously described. It should be understood that the rectangular shape of the "cliff" shaped etch features 330 as shown in FIG. 3A is provided by way of example. In some embodiments, the "cliff" shaped etch features 330 may indeed have a substantially rectangular shape. However, in other embodiments, the "cliff" shaped etch features 330 can have a different shape, i.e., a shape other than substantially rectangular, as required for a particular application.

Figure 4A:
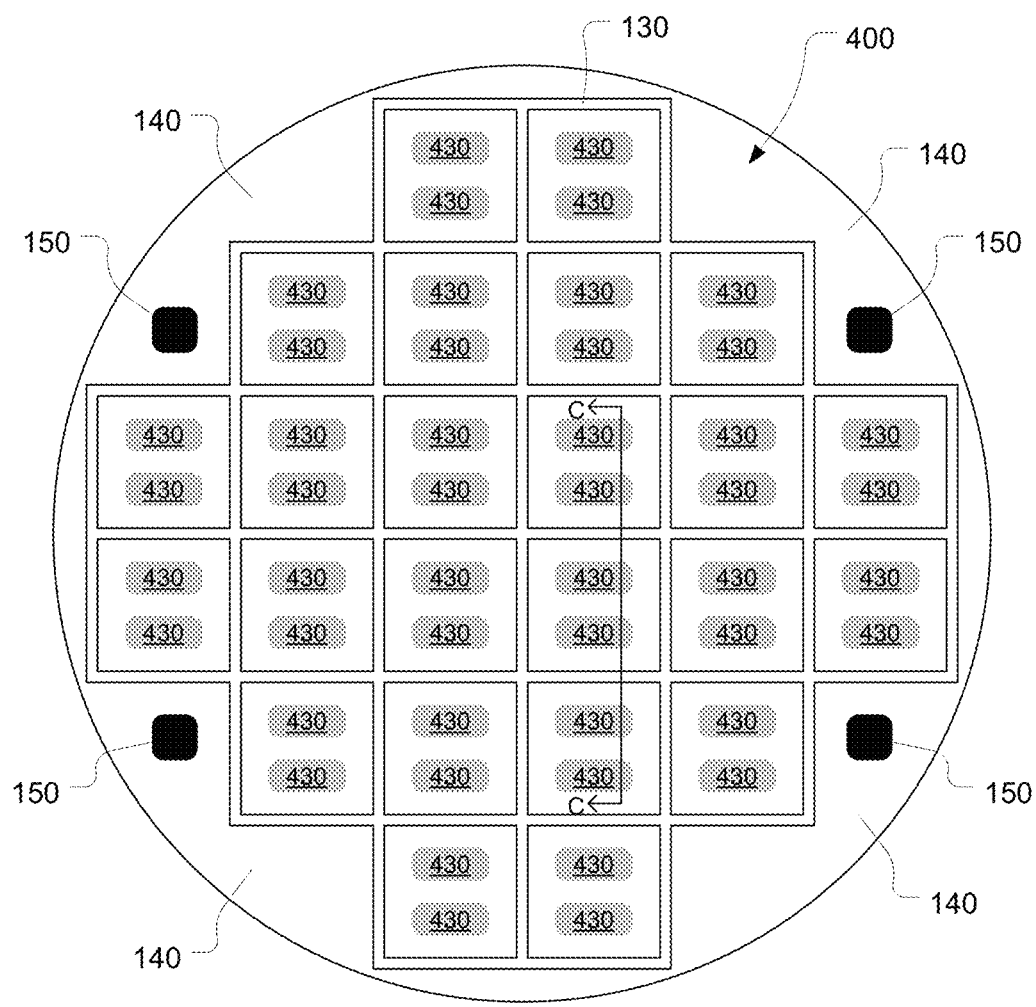
FIG. 4A shows a frontside view of the wafer with the "canyon" configuration, in accordance with some embodiments of the present invention.
Figure 4B:
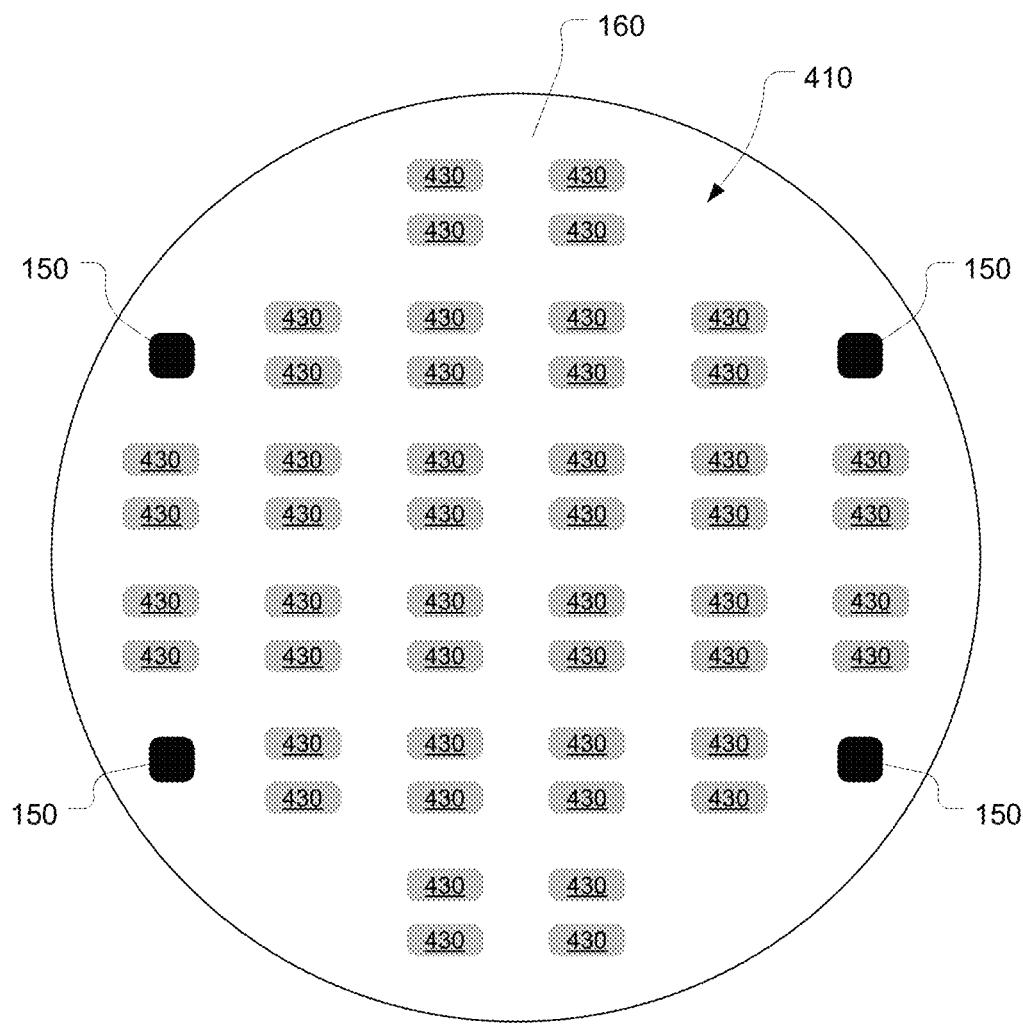
FIG. 4B shows a backside view of the wafer with the "canyon" configuration, in accordance with some embodiments of the present invention.
Figure 4C:
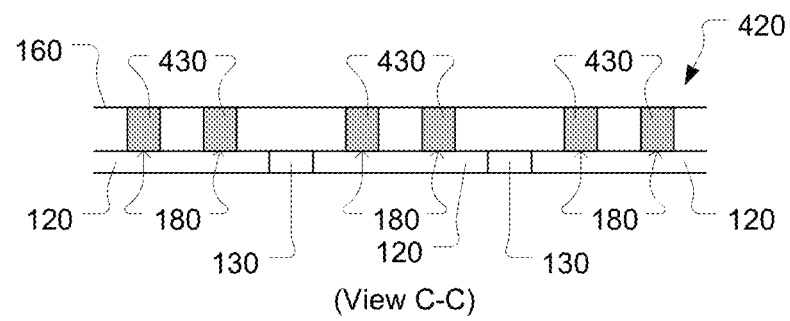
FIG. 4C shows a cross-section view through the wafer with the "canyon" configuration with the backside of the wafer facing upward, in accordance with some embodiments of the present invention.

In some embodiments, a given etched region on the backside of the wafer can take the shape of a "canyon," in which the given etched region does not extend into the chip kerf region(s) 130. For example, FIGS. 4A-4C show a wafer on which features are etched through the backside of the wafer in a "canyon" configuration, in accordance with some embodiments of the present invention. FIG. 4A shows a frontside view 400 of the wafer with the "canyon" configuration, in accordance with some embodiments of the present invention. FIG. 4B shows a backside view 410 of the wafer with the "canyon" configuration, in accordance with some embodiments of the present invention. FIG. 4C shows a cross-section view 420 (reference as View C-C in FIG. 4A) through the wafer with the "canyon" configuration with the backside 160 of the wafer facing upward, in accordance with some embodiments of the present invention. The "canyon" shaped etch features are etched through the backside of the wafer. In some embodiments, such as shown in FIG. 4C, the "canyon" shaped etch features 430 stop at a dielectric layer 180 within the wafer. However, in other embodiments, the "canyon" shaped etch features can be defined to stop at any given position and/or material layer within the wafer. Each "canyon" shaped etch feature 430 is confined within the region corresponding to the backside of a given chip 120, and is spaced some distance away from the chip kerf region(s) 130 that surround the given chip 120. In some embodiments, the "canyon" shaped etch features 430 can be backfilled with a dielectric material and planarized following the backside etching process in a manner such as previously described. It should be understood that the rectangular shape of the "canyon" shaped etch features 430 as shown in FIG. 4A is provided by way of example. In some embodiments, the "canyon" shaped etch features 430 may indeed have a substantially rectangular shape. However, in other embodiments, the "canyon" shaped etch features 430 can have a different shape, i.e., a shape other than substantially rectangular, as required for a particular application.

Figure 5A:
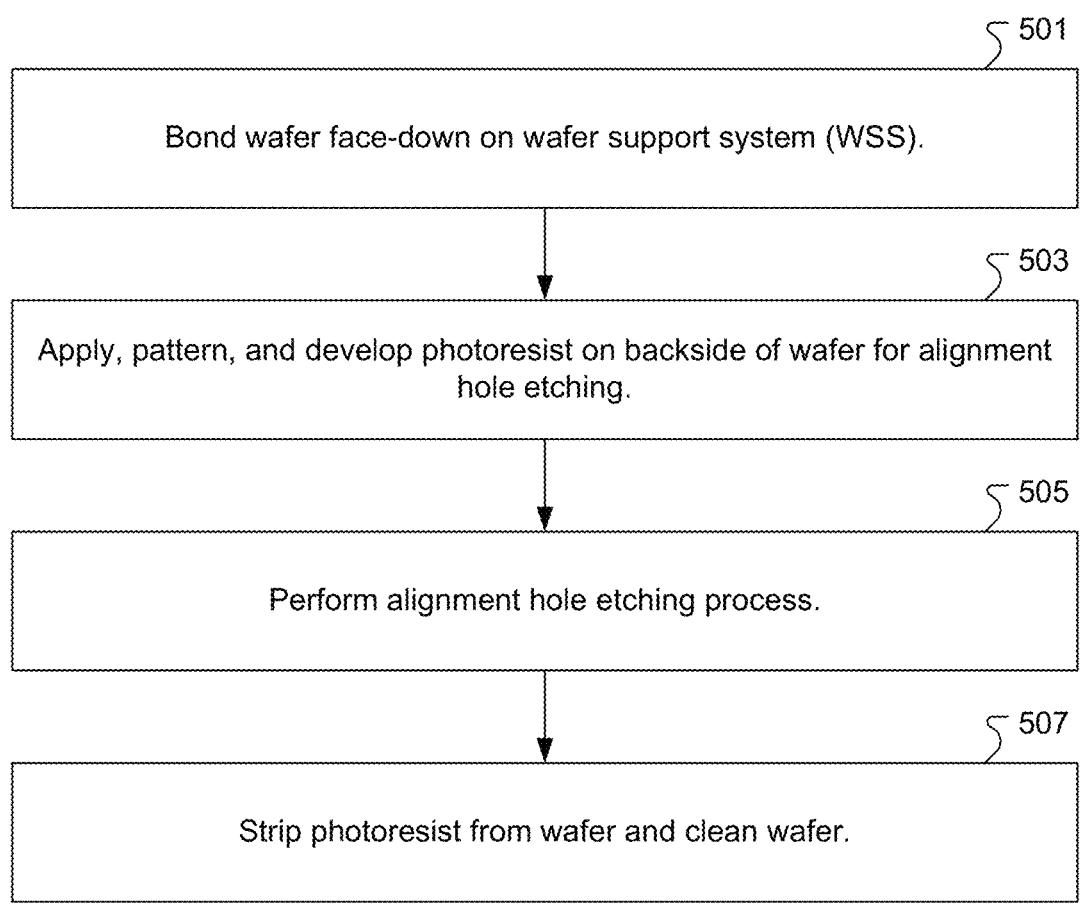
FIG. 5A shows a flowchart of a method for processing a wafer to enable alignment of the wafer from a backside of the wafer, in accordance with some embodiments of the present invention.

FIG. 5A shows a flowchart of a method for processing a wafer to enable alignment of the wafer from a backside of the wafer, in accordance with some embodiments of the present invention. The method includes an operation 501 for bonding a wafer face-down on a wafer support system (WSS). In the operation 501, the wafer is flipped upside-down, such that the silicon handle and/or substrate of the wafer is facing up and the interconnect layers within the wafer are facing down toward the WSS. In some embodiments, following operation 501, a number of optional operations can be performed in which the wafer's silicon handle member and/or substrate is background, polished, polyground, and/or lapped in order to thin the thickness of the silicon handle member and/or substrate. Then, the method proceeds with an operation 503 for applying, patterning, and developing photoresist on the backside of the wafer, i.e., on the exposed surface of the silicon handle member and/or substrate of the wafer, to define and expose the areas to be etched for creation of holes to be used in alignment of the wafer. In some embodiments, the operation 503 includes spinning the photoresist material on the backside of the wafer, exposing the photoresist material for patterning, developing the photoresist material, and baking of the photoresist material to define regions within which the backside of the wafer is exposed through the photoresist material for etching to form alignment holes. In some embodiments, the alignment holes are located in unused peripheral regions of the wafer. In some embodiments, the alignment holes are located over portions of partially formed (unusable) chips. In some embodiments, the alignment holes are located over completely formed (usable) chips.

The method then proceeds with an operation 505 in which an etching process is performed to create etched regions, i.e., holes, within the regions on the backside of the wafer that are exposed through the photoresist material. Thus, in operation 505, the silicon handle member and/or substrate of the wafer is etched from the backside of the wafer. In some embodiments, operation 505 is performed to etch the alignment holes down into the wafer, from the backside of the wafer, to a prescribed depth and/or material layer. For example, in some embodiments, the alignment holes are etched to an oxide layer within the wafer. In such embodiments, the etchant can be chosen to have a high silicon-to-oxide selectivity, such as $SF_6$, $XeF_2$, KOH, or TMAH, so that the silicon handle member of the wafer is etched with a clean stop at the oxide layer within the wafer. It should be understood, however, that in other embodiments, the alignment holes can be etched down to essentially any depth and/or material present within the wafer, using an appropriate etching process. In some embodiments, the method then optionally proceeds with an operation 507 to strip the photoresist from the wafer and clean the wafer. In some embodiments, the operation 507 includes performing a plasma ashing operation and piranha etching operation to clean the wafer. However, it should be understood that in some embodiments it may be desirable to leave the photoresist material on the wafer rather than perform operation 507. For example, if photo-active polyimide were used as the photoresist material, it may be useful to leave the photoresist material on the wafer as a final buffer film for semiconductor die passivation. Allowing the photoresist material to remain on the wafer as a final buffer film may be of particular benefit if the semiconductor die is to be subjected to injection molded packaging, or some other type of packaging operation that requires a final buffer film.

Figure 5B:
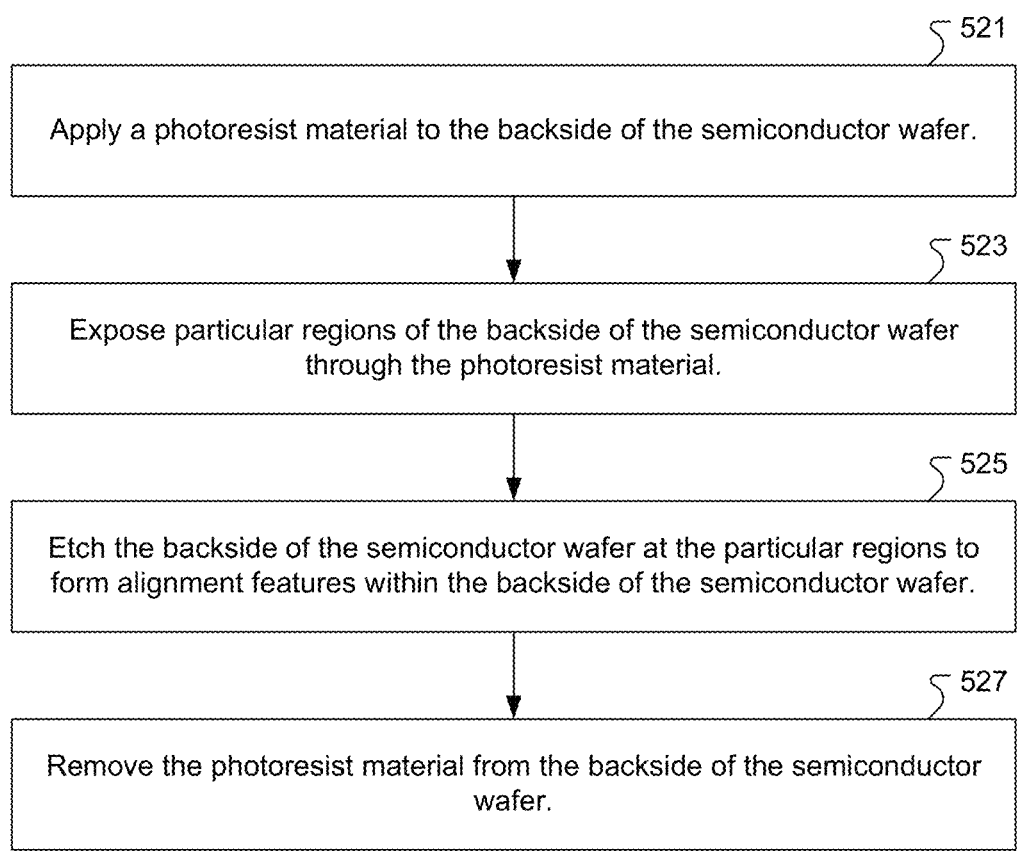
FIG. 5B shows a flowchart of a method for processing a semiconductor wafer to enable alignment of the semiconductor wafer from a backside of the semiconductor wafer, in accordance with some embodiments of the present invention.

FIG. 5B shows a flowchart of a method for processing a semiconductor wafer to enable alignment of the semiconductor wafer from a backside of the semiconductor wafer, in accordance with some embodiments of the present invention. The method includes an operation 521 for applying a photoresist material to the backside of the semiconductor wafer. In some embodiments, the method includes an optional operation for bonding a frontside of the semiconductor wafer to a wafer support system (WSS) before applying the photoresist material to the backside of the semiconductor wafer in operation 521. In some embodiments, the method can include an optional operation for removing a thickness of material from the backside of the semiconductor wafer in a substantially uniform manner across an entirety of the backside of the semiconductor wafer before applying the photoresist material to the backside of the semiconductor wafer in operation 521. The method also includes an operation 523 for exposing particular regions of the backside of the semiconductor wafer through the photoresist material. In some embodiments, each of the particular regions are located within a peripheral portion of the semiconductor wafer that does not provide for manufacture of a complete semiconductor chip.

The method also includes an operation 525 for etching the backside of the semiconductor wafer at the particular regions to form alignment features within the backside of the semiconductor wafer. In some embodiments, a number of the alignment features is at least two. In some embodiments, each of the alignment features is a hole formed through the backside of the semiconductor wafer to a prescribed depth within an overall thickness of the semiconductor wafer. In some embodiments, the prescribed depth corresponds to an etch stop material present within the semiconductor wafer. In some embodiments, the etch stop material is an oxide layer. In some embodiments, the prescribed depth reveals one or more frontside features of the semiconductor wafer within the hole, wherein the frontside features are detectable through the alignment feature to assist with alignment of the semiconductor wafer. In some embodiments, the method optionally includes an operation 527 for removing the photoresist material from the backside of the semiconductor wafer. However, it should be understood that in some embodiments it may be desirable to leave the photoresist material on the wafer rather than perform operation 527. For example, if photo-active polyimide were used as the photoresist material, it may be useful to leave the photoresist material on the wafer as a final buffer film for semiconductor die passivation. Allowing the photoresist material to remain on the wafer as a final buffer film may be of particular benefit if the semiconductor die is to be subjected to injection molded packaging, or some other type of packaging operation that requires a final buffer film.

In some example embodiments, such as described herein with regard to the methods of FIGS. 5A and 5B, one or more holes are etched through the backside of a semiconductor wafer, i.e., through the substrate or handle of the wafer, for use in alignment of subsequent lithographic masks. In some embodiments, the one or more holes are etched through the substrate/handle of the wafer to stop at a dielectric material within the wafer, where the dielectric material serves as an etch stop. In some embodiments, the one or more holes are located within an edge region of the wafer, either where no die is located or where a partially formed die is located. In some embodiments, a patterned photoresist material is formed on the backside of the wafer for use as a mask to etch the one or more holes through the backside of the wafer. In some embodiments, the backside of the wafer is thinned through polishing, backgrinding, and/or lapping to a thickness within a range extending from about 10 micrometers to about 254 micrometers, before the photoresist material is applied to the backside of the wafer and patterned to expose the specific locations at which the one or more holes will be etched through the backside of the wafer. In some embodiments, the one or more holes are etched through the backside of the wafer using an etchant of $SF_6$, $XeF_2$, KOH, TMAH, or another etchant with high selectivity between silicon and oxides or nitrides.

Figure 6A:
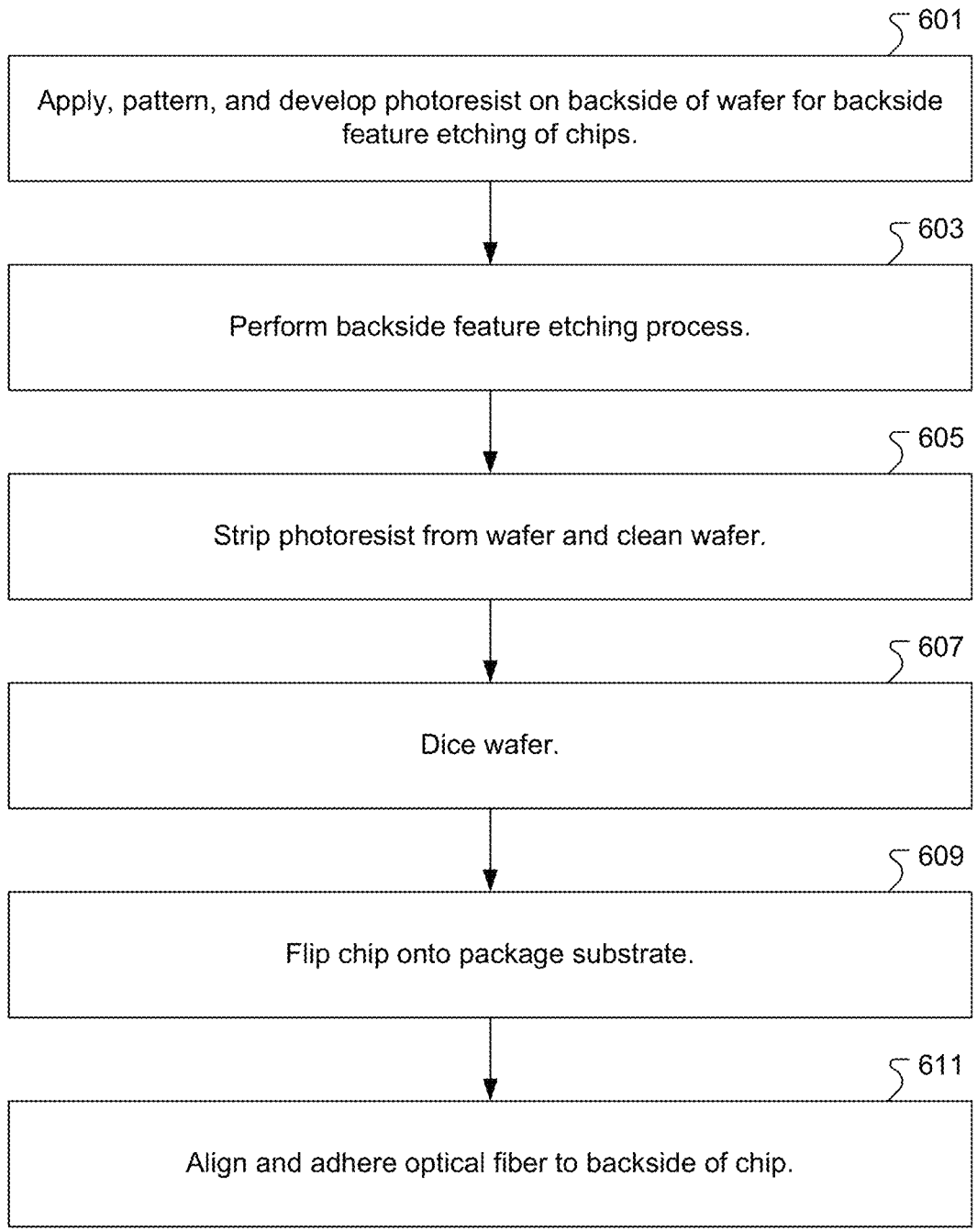
FIG. 6A shows a flowchart of a method for processing a backside of a semiconductor chip to enable connection of a photonic device to the backside of the semiconductor chip, in accordance with some embodiments of the present invention.

FIG. 6A shows a flowchart of a method for processing a backside of a semiconductor chip to enable connection of a photonic device to the backside of the semiconductor chip, in accordance with some embodiments of the present invention. In the method of FIG. 6A, an etching process is performed on the backside of the wafer with the wafer intact, i.e., before dicing/singulation of the wafer. The method includes an operation 601 applying, patterning, and developing photoresist on the backside of the wafer, i.e., on the exposed surface of the silicon handle member and/or substrate of the wafer, to define the areas to be etched into the backside of the chips and/or over dicing channels/kerf regions. In some embodiments, the operation 601 includes spinning the photoresist material on the backside of the wafer, exposing the photoresist material for patterning, developing the photoresist material, and baking of the photoresist material to define etching regions on the backside of the wafer.

In some embodiments, prior to the operation 601, the wafer is first subjected to the alignment hole creation method of FIG. 5A or FIG. 5B. In these embodiments, the resulting alignment holes are used to align the wafer with lithographic tools from the backside of the wafer. Note that if either a front-back camera or the described infrared camera system of FIG. 2 is available, it may not be necessary to perform the method of FIG. 5A or FIG. 5B. Both the front-back camera system and the described infrared camera system of FIG. 2 allow alignment of the backside of the wafer using frontside features without the need to etch an alignment hole in the backside of the wafer to enable observation of frontside features from the backside of the wafer.

The method proceeds with an operation 603 in which an etching process is performed to create etched features, e.g., cliffs, canyons, holes, or the like, within the areas on the backside of the wafer that are exposed through the photoresist material. Thus, in operation 603, the silicon handle member and/or substrate of the wafer is etched. In some embodiments, operation 603 is performed to etch the features down into the wafer, from the backside of the wafer, to a prescribed depth and/or material layer. For example, in some embodiments, the etched features are etched down to an oxide layer within the wafer. In such embodiments, the etchant can be chosen to have a high silicon-to-oxide selectivity, such as $XeF_2$, KOH, or TMAH, so that the silicon handle member and/or substrate of the wafer is etched with a clean stop at the oxide layer within the wafer. It should be understood, however, that in other embodiments, the etched features can be etched down to essentially any depth and/or material present within the wafer, using an appropriate etching process. The method then optionally proceeds with an operation 605 to strip the photoresist from the wafer and clean the wafer. In some embodiments, the operation 605 includes performing a plasma ashing operation and piranha etching operation to clean the wafer. However, it should be understood that in some embodiments it may be desirable to leave the photoresist material on the wafer rather than perform operation 605. For example, if photo-active polyimide were used as the photoresist material, it may be useful to leave the photoresist material on the wafer as a final buffer film for semiconductor die passivation. Allowing the photoresist material to remain on the wafer as a final buffer film may be of particular benefit if the semiconductor die is to be subjected to injection molded packaging, or some other type of packaging operation that requires a final buffer film.

In some embodiments, the method can include one or more operations to backfill the etched features within the backside of the wafer, i.e., within the backside of the chips formed across the wafer, with a particular material, such as with a dielectric material or with an optical transmitting material, or with essentially any other material as needed for a prescribed application. In some embodiments, the backfilling material can be spun on the backside of the wafer and planarized as needed to be flush with the surface of the silicon handle member and/or substrate of the wafer.

The method then proceeds with operation 607 for dicing/singulating of the wafer to obtain individual chips from the wafer. In some embodiments, the wafer can be attached to a WSS prior to operation 607 to provide mechanical support to the wafer and chips as the wafer is diced/singulated. After operation 607, the method can include an operation 609 for packaging of the individual chips. In some embodiments, operation 609 includes flipping the chip onto a packaging substrate and attaching the chip to the packaging substrate, such as with a solder ball attachment mechanism, or the like. The operation 609 can also include underfilling of open space between the chip and package. The method can also include an operation 611 for aligning and attaching one or more optical components, e.g., photonic devices and/or optical fibers and/or other optical device, to etched features on the backside of the packaged chip.

In some embodiments, after the operation 603, the method can include the following optional series of operations:
Bond a III-V material die on the bottom of an etched trench over a photonic structure defined in a poly-Si layer or a body-Si layer.
Remove a substrate of the III-V material die by etching.
Deposit metal to exposed III-V material die contact regions to form contacts to the structure.
Connect the III-V material die structure contacts to exposed substrate taps or BITIE of the chip to form a connection to interconnect layers within the chip.

Figure 6B:
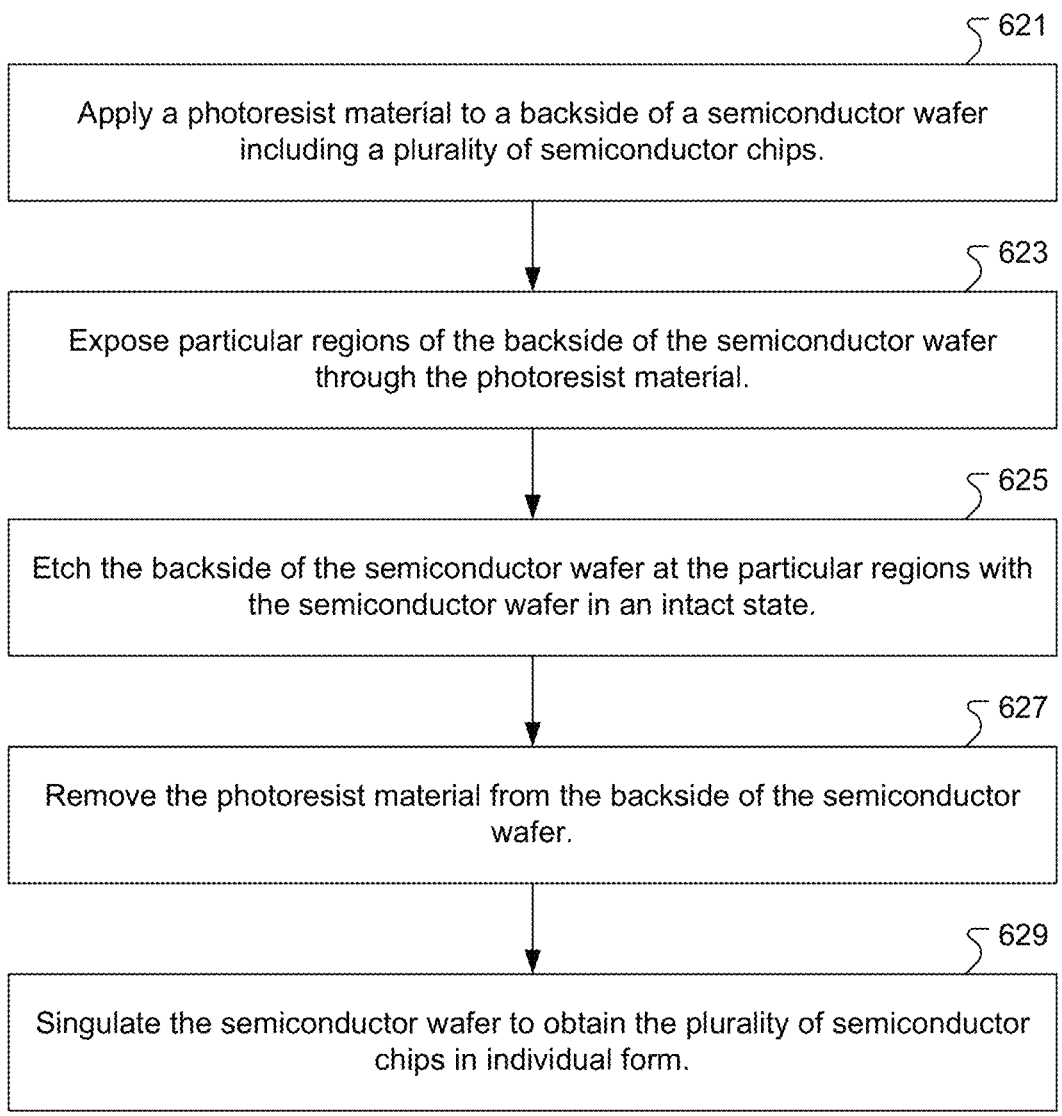
FIG. 6B shows a flowchart of a method for processing a backside of a semiconductor chip for connection of an optical component to the backside of the semiconductor chip, in accordance with some embodiments of the present invention.

FIG. 6B shows a flowchart of a method for processing a backside of a semiconductor chip for connection of an optical component to the backside of the semiconductor chip, in accordance with some embodiments of the present invention. The method includes an operation 621 for applying a photoresist material to a backside of a semiconductor wafer including a plurality of semiconductor chips. The method also includes an operation 623 for exposing particular regions of the backside of the semiconductor wafer through the photoresist material. The particular regions collectively include a portion of a backside of each of the plurality of semiconductor chips. In some embodiments, each of the particular regions extends across both a portion of a first semiconductor chip and a portion of a second semiconductor chip and extends across a chip kerf region that separates the first and second semiconductor chips on the semiconductor wafer, such as described above with regard to the "cliff" shaped etch features. In some embodiments, each of the particular regions is wholly located inside of a peripheral boundary of a single semiconductor chip on the semiconductor wafer, and each of the plurality of semiconductor chips has at least one of the particular regions located inside of its peripheral boundary, such as described above with regard to the "canyon" shaped etch features. Also, in some embodiments, the particular regions include chip kerf regions that define boundaries of the plurality of semiconductor chips. In this manner, areas on the backside of the semiconductor wafer corresponding to the chip kerf region are subject to etching to provide for singulation/dicing of the semiconductor wafer with lower mechanical stress at a later time. The chip kerf region etching can be done in combination with essentially shape and location of the particular regions for chip backside etching.

In some embodiments, the operation 623 for exposing particular regions of the backside of the semiconductor wafer through the photoresist material can include aligning the semiconductor wafer by optical detection of frontside features of the semiconductor wafer from the backside of the semiconductor wafer. In some embodiments, the optical detection of frontside features of the semiconductor wafer includes viewing the frontside features through holes etched within a material that forms the backside of the semiconductor wafer, such as described with regard to the method of FIGS. 5A and 5B. In some embodiments, the optical detection of frontside features of the semiconductor wafer includes illuminating the backside of the semiconductor wafer with an infrared light source and viewing infrared light reflected from the frontside features using an infrared camera. In some embodiments, optical detection of frontside features of the semiconductor wafer includes viewing the frontside features through a camera that is spatially indexed to a frontside of the semiconductor wafer and that is positioned to view a backside of the semiconductor wafer.

The method also includes an operation 625 for etching the backside of the semiconductor wafer at the particular regions with the semiconductor wafer in an intact state. The method can also include an optional operation 627 for removing the photoresist material from the backside of the semiconductor wafer. However, it should be understood that in some embodiments it may be desirable to leave the photoresist material on the wafer rather than perform operation 627. For example, if photo-active polyimide were used as the photoresist material, it may be useful to leave the photoresist material on the wafer as a final buffer film for semiconductor die passivation. Allowing the photoresist material to remain on the wafer as a final buffer film may be of particular benefit if the semiconductor die is to be subjected to injection molded packaging, or some other type of packaging operation that requires a final buffer film.

The method also includes an operation 629 for singulating the semiconductor wafer to obtain the plurality of semiconductor chips in individual form. The backside of each of the plurality of semiconductor chips includes an etched region corresponding to at least a portion of at least one of the particular regions. In some embodiments, the etched region within a given semiconductor chip is a hole formed through the backside of the given semiconductor chip to a prescribed depth within an overall thickness of the given semiconductor chip. In some embodiments, the prescribed depth corresponds to an etch stop material present within the given semiconductor wafer. In some embodiments, the etch stop material is an oxide layer.

The method can also include an operation for attaching an optical component within the etched region within the backside of at least one of the plurality of semiconductor chips. Also, in some embodiments, the particular regions include one or more areas on the backside of each of the plurality of semiconductor chips for placement of one or more optical fibers in optical communication with the optical component. In some embodiments, the optical component is a III-V material die. Also, in some embodiments, the method can include positioning an optical waveguide within the etched region before attaching the optical component within the etched region.

In some example embodiments, such as described with regard to the methods of FIGS. 6A and 6B, etched regions are formed in the backside of a semiconductor wafer to provide locations for attachment of electro-optical devices to the chips/dies formed within the wafer. In some embodiments, the etched regions are holes. In some embodiments, the etched regions are holes formed as canyon structures where a given etched region is wholly located within a given chip/die region on the wafer such that the given etch region does not extend into/through a wafer dicing channel (kerf region). In some embodiments, the etched regions are holes formed as cliff structures where a given etched region extends from one chip/die region on the wafer into/through a wafer dicing channel (kerf region) to another chip/die region on the wafer. In some embodiments, the etched regions are etched into the backside of the wafer to a dielectric layer within the wafer, with the dielectric layer serving as an etch stop. In some embodiments, the etch stop dielectric layer is a buried oxide layer of a silicon-on-insulator (SOI) wafer. In some embodiments, the etch stop dielectric layer is a shallow trench isolation (STI) layer. In some embodiments, the etch stop dielectric layer is a deep trench isolation (DTI) layer. In some embodiments, the etch stop dielectric layer is formed of one or more of silicon dioxide and a silicon nitride, or a combination of oxide and nitride materials.

In some embodiments, photoresist is used to form a mask on the backside of the wafer for etching of the etched regions. In some embodiments, before application of photoresist material to the backside of the wafer to prepare the mask for etching of the etched regions, the backside of the wafer is thinned by polishing, backgrinding, and/or lapping to a thickness within a range extending from about 10 micrometers to about 254 micrometers. In some embodiments, the empty space corresponding to the etched region is backfilled with a backfill material. In some embodiments, the backfill material is one or more of silicon dioxide, silicon nitride, and other oxide and/or nitride material. In some embodiments, the backfill material is one or more of epoxy, optical adhesive, other type of adhesive, and polymer. In some embodiments, the backfill material has an index of refraction within a range extending from about 1.3 to about 1.6.

In the various embodiments disclosed herein in which the backside of the semiconductor wafer is etched, an unusable area of the wafer along the radial periphery of the wafer serves as a sacrificial region during the etching process to protect fully-formed chips/dies on the wafer. Therefore, in the various embodiments disclosed herein in which the backside of the semiconductor wafer is etched, it is not necessary to apply a protective sealant to the sides/edges of the wafer to protect from the etching process, i.e., to protect from isotropic etching that may occur along the radial periphery of the wafer.

Figure 7A:
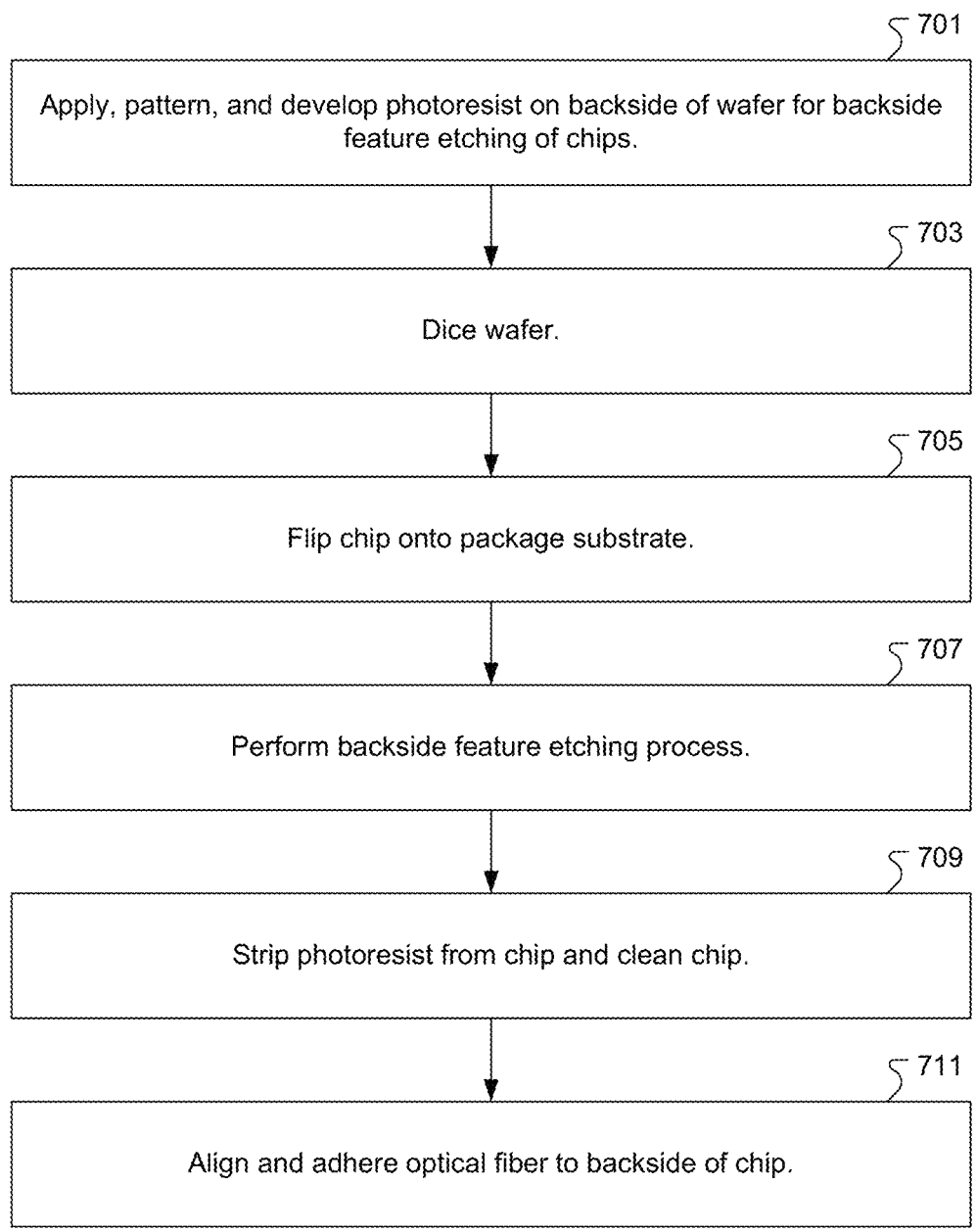
FIG. 7A shows a flowchart of a method for processing the backside of semiconductor chips, in accordance with some embodiments of the present invention.

FIG. 7A shows a flowchart of a method for processing the backside of semiconductor chips, in accordance with some embodiments of the present invention. In the method of FIG. 7A, an etching process is performed on the backside of individual chips after the wafer is diced/singulated. The method includes an operation 701 for applying, patterning, and developing photoresist on the backside of the wafer, i.e., on the exposed surface of the silicon handle member and/or substrate of the wafer, to define the areas to be etched into the backside of the chips and/or over dicing channels/kerf regions. In various embodiments, the features to be etched can be cliff features, canyon features, holes, and/or other types of etched feature shapes. In some embodiments, the operation 701 includes spinning the photoresist material on the backside of the wafer, exposing the photoresist material for patterning, developing the photoresist material, and baking of the photoresist material to define etching regions on the backside of the wafer.

In some embodiments, prior to the operation 701, the wafer is first subjected to the alignment hole creation method of FIG. 5A or FIG. 5B. In these embodiments, the resulting alignment holes are used to align the wafer with lithographic tools from the backside of the wafer. Note that if either a front-back camera or the described infrared camera system of FIG. 2 is available, it may not be necessary to perform the method of FIG. 5A or FIG. 5B. Both the front-back camera system and the described infrared camera system of FIG. 2 allow alignment of the backside of the wafer using frontside features without the need to etch an alignment hole for observing frontside features from the backside of the wafer.

Following the operation 701, the method proceeds with an operation 703 in which the wafer is diced/singulated to obtain individual chips from the wafer. In some embodiments, the wafer can be adhered to a WSS prior to operations 701 and/or 703 to provide mechanical support to the wafer and chips as the wafer is diced/singulated. After operation 703, the method can include an operation 705 for packaging of the individual chips. In some embodiments, operation 705 includes flipping the chip onto a packaging substrate and attaching the chip to the packaging substrate, such as with a solder ball attachment mechanism, or the like. The operation 705 can also include underfilling of open space between the chip and package.

Following the operation 705, the method proceeds with an operation 707 in which an etching process is performed on the individual chips to create etched features, i.e., cliffs, canyons, holes, or the like, within the areas on the backside of the individual chips that are exposed through the photoresist material that was applied in operation 701. Thus, in operation 707, the silicon handle member and/or substrate of the individual chip is etched. In some embodiments, operation 707 is performed to etch the features down into the chip, from the backside of the chip, to a prescribed depth and/or material layer. For example, in some embodiments, the etched features are etched down to an oxide layer within the chip. In such embodiments, the etchant can be chosen to have a high silicon-to-oxide selectivity, such as $SF_6$, $XeF_2$, KOH, or TMAH, so that the silicon handle member and/or substrate of the chip is etched with a clean stop at the oxide layer within the chip. It should be understood, however, that in other embodiments, the etched features can be etched down to essentially any depth and/or material present within the chip, using an appropriate etching process. The method then optionally proceeds with an operation 709 to strip the photoresist from the chip and clean the chip. In some embodiments, the operation 709 includes performing a plasma ashing operation and piranha etching operation to clean the chip. In some embodiments, the operation 709 includes a rinsing process. However, it should be understood that in some embodiments it may be desirable to leave the photoresist material on the wafer rather than perform operation 709. For example, if photo-active polyimide were used as the photoresist material, it may be useful to leave the photoresist material on the wafer as a final buffer film for semiconductor die passivation. Allowing the photoresist material to remain on the wafer as a final buffer film may be of particular benefit if the semiconductor die is to be subjected to injection molded packaging, or some other type of packaging operation that requires a final buffer film.

In some embodiments, the method can include one or more operations to backfill the etched features within the backside of the chip with a particular material, such as with a dielectric material or with an optical transmitting material, or with essentially any other material as needed for a prescribed application. In some embodiments, the backfilling material can be spun on the backside of the chip and planarized as needed to be flush with the surface of the silicon handle member and/or substrate of the chip. The method also includes an operation 711 for performing post-photoresist-removal packaging steps, such as aligning and attaching one or more optical fibers to etched features on the backside of the packaged chip.

Figure 7B:
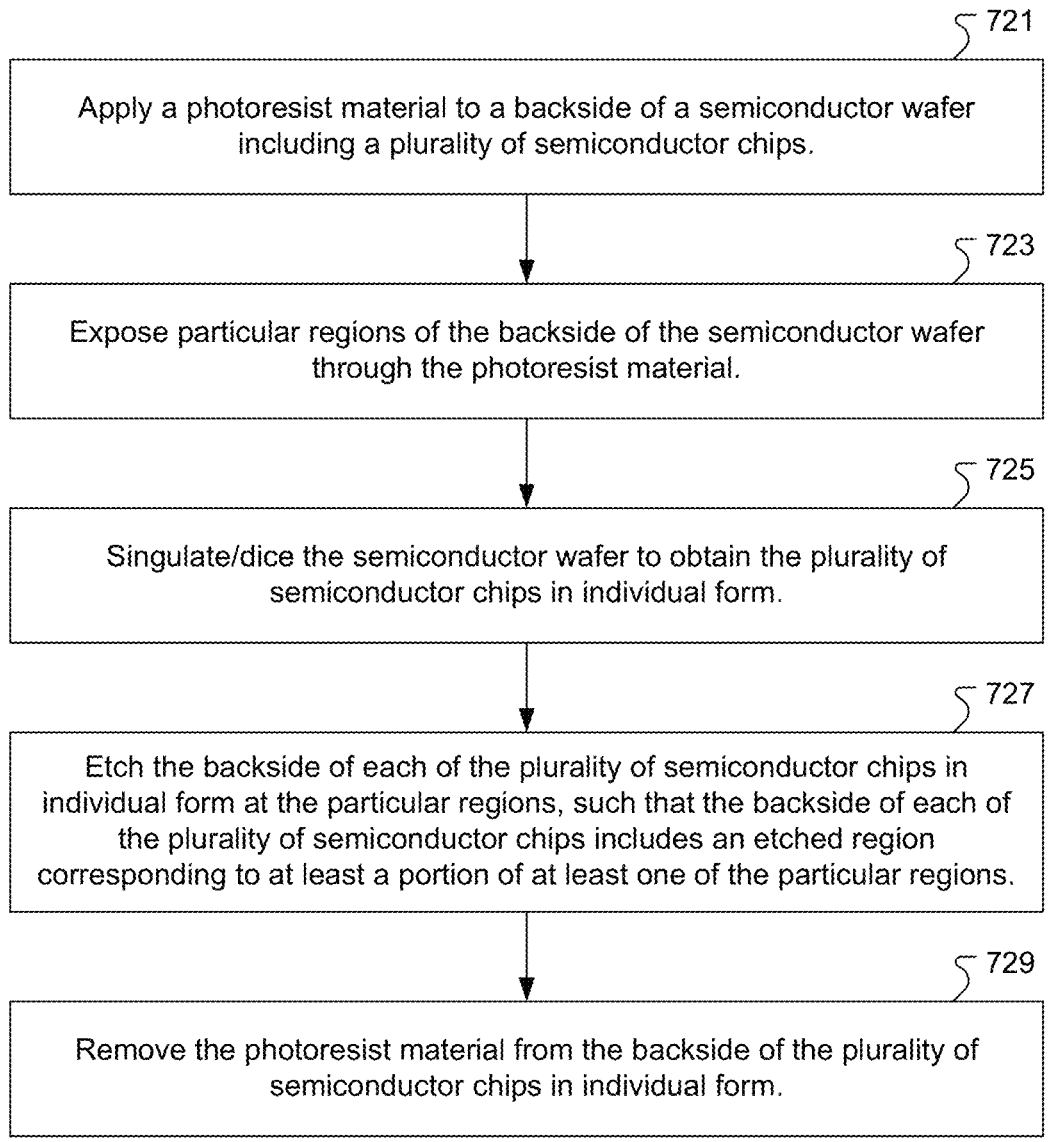
FIG. 7B shows a flowchart of a method for processing a backside of a semiconductor chip for connection of an optical component to the backside of the semiconductor chip, in accordance with some embodiments of the present invention.

FIG. 7B shows a flowchart of a method for processing a backside of a semiconductor chip for connection of an optical component to the backside of the semiconductor chip, in accordance with some embodiments of the present invention. The method includes an operation 721 for applying a photoresist material to a backside of a semiconductor wafer including a plurality of semiconductor chips. The method also includes an operation 723 for exposing particular regions of the backside of the semiconductor wafer through the photoresist material. The particular regions collectively include a portion of a backside of each of the plurality of semiconductor chips. The particular regions collectively include a portion of a backside of each of the plurality of semiconductor chips. In some embodiments, each of the particular regions extends across both a portion of a first semiconductor chip and a portion of a second semiconductor chip and extends across a chip kerf region that separates the first and second semiconductor chips on the semiconductor wafer, such as described above with regard to the "cliff" shaped etch features. In some embodiments, each of the particular regions is wholly located inside of a peripheral boundary of a single semiconductor chip on the semiconductor wafer, and each of the plurality of semiconductor chips has at least one of the particular regions located inside of its peripheral boundary, such as described above with regard to the "canyon" shaped etch features. Also, in some embodiments, the particular regions include chip kerf regions that define boundaries of the plurality of semiconductor chips. In this manner, areas on the backside of the semiconductor wafer corresponding to the chip kerf region are subject to etching to provide for lower mechanical stress during singulation/dicing of the semiconductor wafer at a later time. The chip kerf region etching can be done in combination with essentially shape and location of the particular regions for chip backside etching.

In some embodiments, the operation 723 for exposing particular regions of the backside of the semiconductor wafer through the photoresist material can include aligning the semiconductor wafer by optical detection of frontside features of the semiconductor wafer from the backside of the semiconductor wafer. In some embodiments, the optical detection of frontside features of the semiconductor wafer includes viewing the frontside features through holes etched within a material that forms the backside of the semiconductor wafer, such as described with regard to the method of FIGS. 5A and 5B. In some embodiments, the optical detection of frontside features of the semiconductor wafer includes illuminating the backside of the semiconductor wafer with an infrared light source and viewing infrared light reflected from the frontside features using an infrared camera. In some embodiments, optical detection of frontside features of the semiconductor wafer includes viewing the frontside features through a camera that is spatially indexed to a frontside of the semiconductor wafer and that is positioned to view a backside of the semiconductor wafer.

The method also includes an operation 725 for singulating/dicing the semiconductor wafer to obtain the plurality of semiconductor chips in individual form. It should be understood that in this example embodiment the semiconductor wafer is singulated/diced with the patterned and developed photoresist material present on the backside of the semiconductor wafer, and before the etching of the backside material of the semiconductor chips exposed through the patterned and developed photoresist. The method also includes an operation 727 for etching the backside of each of the plurality of semiconductor chips in individual form at the particular regions, such that the backside of each of the plurality of semiconductor chips includes an etched region corresponding to at least a portion of at least one of the particular regions. In some embodiments, the etched region within a given semiconductor chip is a hole formed through the backside of the given semiconductor chip to a prescribed depth within an overall thickness of the given semiconductor chip. In some embodiments, the prescribed depth corresponds to an etch stop material present within the given semiconductor wafer. In some embodiments, the etch stop material is an oxide layer. The method can also include an optional operation 729 for removing the photoresist material from the backside of the plurality of semiconductor chips in individual form. However, it should be understood that in some embodiments it may be desirable to leave the photoresist material on the wafer rather than perform operation 729. For example, if photo-active polyimide were used as the photoresist material, it may be useful to leave the photoresist material on the wafer as a final buffer film for semiconductor die passivation. Allowing the photoresist material to remain on the wafer as a final buffer film may be of particular benefit if the semiconductor die is to be subjected to injection molded packaging, or some other type of packaging operation that requires a final buffer film.

The method can also include an operation for attaching an optical component within the etched region within the backside of at least one of the plurality of semiconductor chips. Also, in some embodiments, the particular regions include one or more areas on the backside of each of the plurality of semiconductor chips for placement of one or more optical fibers in optical communication with the optical component. In some embodiments, the optical component is a III-V material die. Also, in some embodiments, the method can include positioning an optical waveguide within the etched region before attaching the optical component within the etched region.

In some example embodiments, such as described with regard to the methods of FIGS. 7A and 7B, etched regions are formed in the backside of individual chips/dies after they are singulated/diced from a semiconductor wafer to provide locations for attachment of electro-optical devices to the chips/dies. In some embodiments, the etched regions are holes. In some embodiments, the etched regions are holes formed as canyon structures where a given etched region is wholly located within a given chip/die such that the given etch region does not extend to a peripheral edge of the chip/die. In some embodiments, the etched regions are holes formed as cliff structures where a given etched region extends to a peripheral edge of the chip/die. In some embodiments, the etched regions are etched into the backside of the chip/die to a dielectric layer within the chip/die, with the dielectric layer serving as an etch stop. In some embodiments, the etch stop dielectric layer is a buried oxide layer of a silicon-on-insulator (SOI) chip/die. In some embodiments, the etch stop dielectric layer is a shallow trench isolation (STI) layer. In some embodiments, the etch stop dielectric layer is a deep trench isolation (DTI) layer. In some embodiments, the etch stop dielectric layer is formed of one or more of silicon dioxide and a silicon nitride, or a combination of oxide and nitride materials.

In some embodiments, photoresist is used to form a mask on the backside of the wafer for etching of the etched regions within the individual chips/dies before singulation/dicing of the wafer. In some embodiments, before application of photoresist material to the backside of the wafer to prepare the mask for etching of the etched regions, the backside of the wafer is thinned by polishing, backgrinding, and/or lapping to a thickness within a range extending from about 10 micrometers to about 254 micrometers, or to a thickness within a range extending from about 10 micrometers to about 350 micrometers, or to a thickness within a range extending from about 10 micrometers to about 725 micrometers, or to a thickness of about 350 micrometers, or to a thickness of about 725 micrometers, or to a thickness larger than about 725 micrometers. In some embodiments, the empty space corresponding to the etched region is backfilled with a backfill material. In some embodiments, the backfill material is one or more of silicon dioxide, silicon nitride, and other oxide and/or nitride material. In some embodiments, the backfill material is one or more of epoxy, optical adhesive, other type of adhesive, or polymer. In some embodiments, the backfill material has an index of refraction within a range extending from about 1.3 to about 1.6.

In the various embodiments disclosed herein in which the backside of individual chips/dies are etched after they have been singulated/diced from the wafer, an extra area along the edges of the chip/die, such as leftovers of the kerf region and/or any unused area along the edges of the chip/die with a high density of dielectric material (e.g., 10% or more dielectric material), can serve as a sacrificial region during the etching process to protect the chip/die from isotropic etching that may occur along the outer edge of the chip/die during etching of the backside of the chip/die. Therefore, in the various embodiments disclosed herein in which the backside of the individual chip/die is etched, it is not necessary to apply a protective sealant to the sides/edges of the chip/die to protect from the etching process.

Figure 8A:
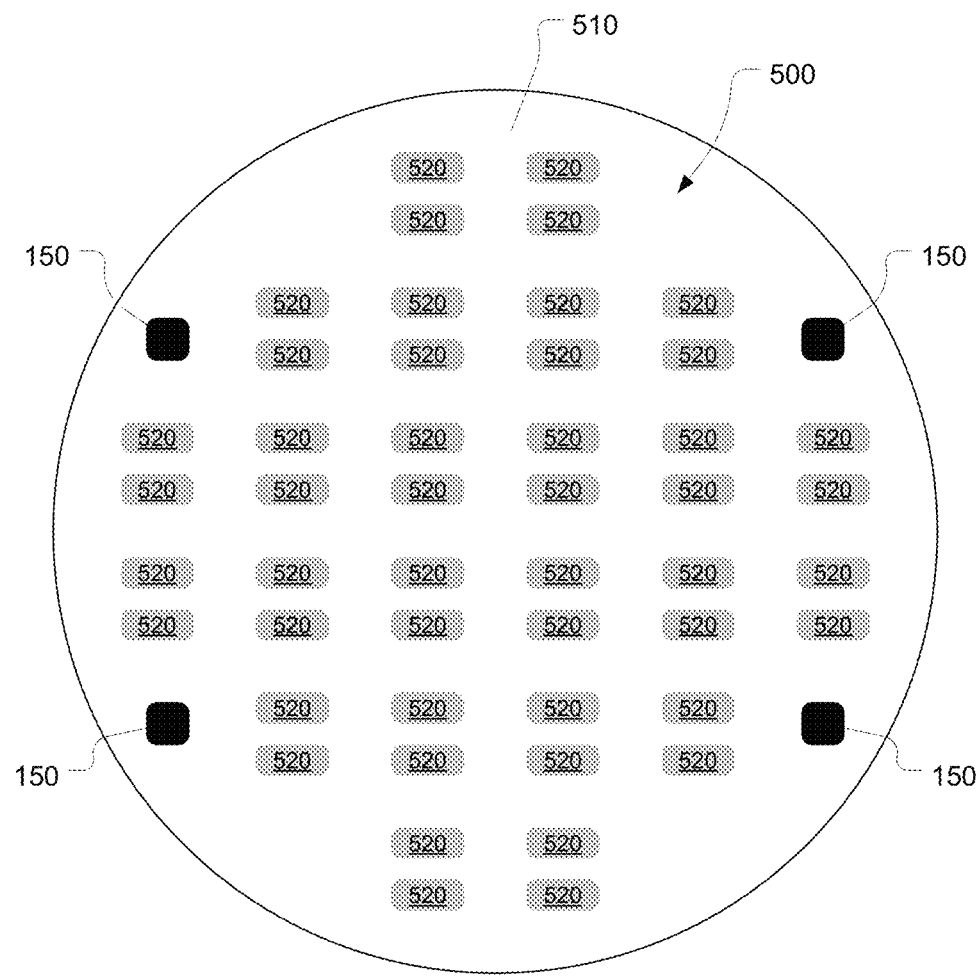
FIG. 8A depicts a backside view of the wafer showing a layer of photoresist material patterned to include openings for forming "canyon" etch features, in accordance with some embodiments of the present invention.
Figure 8B:
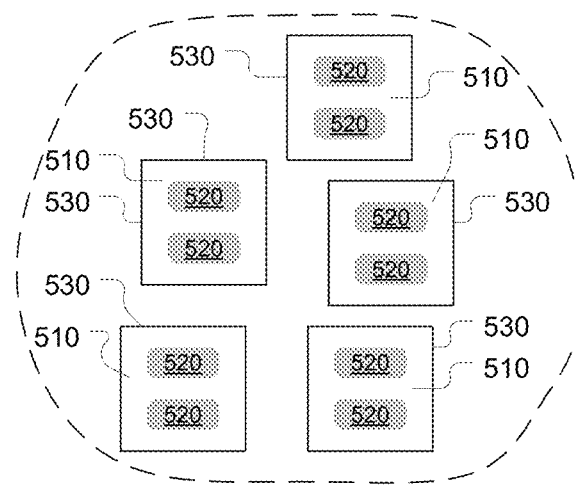
FIG. 8B shows several individual chips after dicing/singulating of the wafer, in accordance with some embodiments of the present invention.

FIGS. 8A through 8E show a sequence of steps corresponding to the methods of FIG. 7A and FIG. 7B, in accordance with some embodiments of the present invention. FIG. 8A depicts a backside view 500 of the wafer showing a layer of photoresist material 510 patterned to include openings 520 for forming "canyon" etch features. The openings 520 in the photoresist material 510 expose the silicon handle member of the chip underneath the photoresist material 510. FIG. 8B shows several individual chips 530 after dicing/singulating of the wafer. It should be noted that the individual chips 530 still have the patterned photoresist material 510, including the openings 520, present on their backside.

Figure 8C:
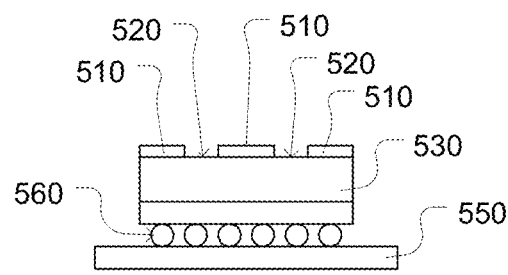
FIG. 8C shows a given chip in a flip-chipped attachment configuration to a package substrate, interposer, or printed circuit board using C4 solder bumps, copper pillars, or other bond materials, in accordance with some embodiments of the present invention.
Figure 8D:
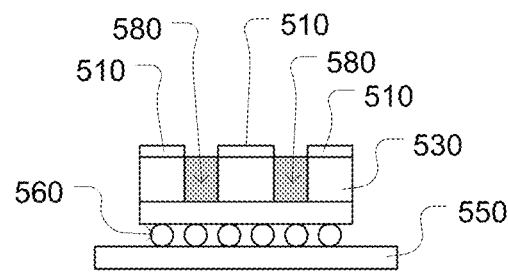
FIG. 8D shows the packaged chip of FIG. 8C after the backside of the chip has been etched through the openings within the photoresist material to create the etch features within the silicon handle member of the chip, in accordance with some embodiments of the present invention.
Figure 8E:
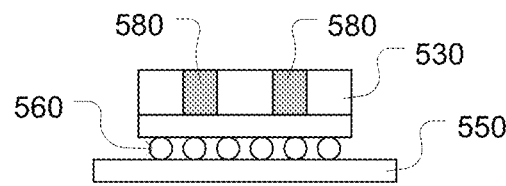
FIG. 8E shows the chip after removal/cleaning of the photoresist material, in accordance with some embodiments of the present invention.

FIG. 8C shows a given chip 530 in a flip-chipped attachment configuration to a package substrate 550, interposer 550, or printed circuit board 550 using C4 solder bumps 560, copper pillars 560, or other bond materials 560. In some embodiments, an underfill material can also be applied in and around the attached chip 530 to mechanically keep the chip 530 bonded to the package substrate 550, interposer 550, or printed circuit board 550. FIG. 8D shows the packaged chip 530 of FIG. 8C after the backside of the chip 530 has been etched through the openings 520 within the photoresist material 510 to create the etch features 580 within the silicon handle member of the chip. In some embodiments, the etch features 580 are backfilled with a prescribed material, e.g., dielectric material, optical material, etc. In some embodiments, the etch features 580 are not backfilled and are left vacant. FIG. 8E shows the chip 530 after removal/cleaning of the photoresist material 510.

The methods, systems, and devices disclosed herein may be used for enabling photonics on a thin-BOX SOI photonics platform, in which the BOX is too thin to provide sufficient isolation between the crystalline silicon body waveguide and the handle silicon substrate. The methods, systems, and devices disclosed herein may also be used for enabling photonics in a bulk CMOS process, in which the shallow trench isolation (STI) region is not thick enough to isolate waveguides made using polysilicon from the bulk silicon substrate. Thin-BOX/STI also enable body-Si/poly-Si photonic structures to form a laser or an optical amplifier with a III-V material die that is bonded on the backside of the etched trench. In other embodiments, the methods, systems, and devices disclosed herein may also be used to provide thermal isolation for devices, optical access through the chip backside, etch of MEMS structures, among other uses.

Figure 9:
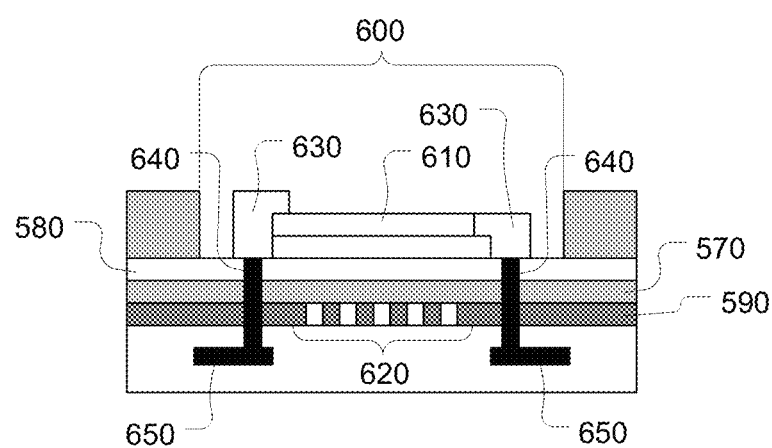
FIG. 9 shows an example embodiment in which a laser is formed in a trench etched within the thin-BOX SOI wafer, in accordance with some embodiments of the present invention.

FIG. 9 shows an example embodiment in which a laser is formed in a trench 600 etched within the thin-BOX SOI wafer. The photonic structure is formed on the wafer by patterning the body-Si 570 and poly-Si 590. A grating structure 620 is formed under the location where the III-V material die 610 is placed. The die 610 is isolated by a thin-BOX 580 to provide adequate coupling between the grating structure and the III-V die 610. Contacts 630 to the III-V die 610 are formed by metal deposition over the thin-BOX and are connected to BITIE structures 640, which connect to the metal interconnect layers 650 on the wafer to provide low-resistance electrical connection. In another embodiment, the III-V material die 610 is placed over the STI region in the etched substrate trench of the bulk-Si wafer. The photonic structure grating 620 is defined in poly-Si and optionally SiN layer, and connection to the interconnect layer is established through the substrate taps exposed by the substrate trench etch.

The methods, systems, and devices disclosed herein provide the following features, among others:
 increased alignment accuracy of process steps performed on the backside (substrate handle) of a semiconductor wafer to features on the frontside of a semiconductor wafer,
 increased mechanical integrity of a semiconductor wafer that has undergone backside processing,
 increased yield of chips singulated from a semiconductor wafer that has undergone backside processing,
 optical isolation of waveguides monolithically processed on bulk CMOS fabrication lines or SOI CMOS fabrication lines,
 high thermal isolation and thermal tuning efficiencies of silicon photonic devices,
 high thermal conductivity for CMOS circuits monolithically integrated with silicon photonic devices,
 improved optical access to silicon photonic devices on a semiconductor wafer,
 integration of III-V materials over thin-BOX in the substrate etched regions,
 formation of lasers and gain chips over thin-BOX, and
 low-resistance connectivity between the III-V material over thin-BOX and SOI wafer interconnect stack, among others.

In an example embodiment, a semiconductor chip or die is bonded facedown to a package substrate, with the backside of the chip/die patterned and either fully etched, partially etched, or a combination of partial and fully etched in accordance with one or more of the methods disclosed herein with regard to FIGS. 5A, 5B, 6A, 6B, 7A, and/or 7B to include etch structures, e.g., "cliff" shaped etch structures or "canyon" shaped etch structures. In some embodiments, some of the patterned features and the full etch depth of the corresponding etch structures have an aspect ratio (width:depth) of 1:1 or X:4, where X is any value of one or greater. In some embodiments, the etch depth of the etch structures within the backside of the chip/die is defined by dielectric layers within the chip/die. In some embodiments, the dielectric layer is the buried oxide layer of a silicon-on-insulator (SOI) wafer. In some embodiments, the dielectric layer is a shallow trench isolation (STI) layer. In some embodiments, the dielectric layer is a deep trench isolation (DTI) layer. In some embodiments, the dielectric layer is silicon dioxide, silicon nitride, other oxides or nitrides, or some combination thereof. In some embodiments, the package substrate (to which the chip/die is bonded facedown) is fabricated of Bismaleimidetriazine (BT), Flame Retardant 4 (FR4), High Temperature Cofired Ceramic (HTCC), Low Temperature Cofired Ceramic (LTCC), silicon, glass, or any combination thereof. In some embodiments, the semiconductor chip/die substrate includes at least one of a group IV element or compound, a III-V compound, or a II-VI compound. In some embodiments, the chip/die is singulated/diced from a wafer that has been thinned by one or more of polishing, backgrinding, and lapping to a thickness within a range extending from about 10 micrometers to about 254 micrometers, and patterned after thinning (with hard or resist mask) to a define the trench region for etching. In some embodiments, the chip/die is bonded facedown to a package substrate and exposed to dry-etch (e.g., $XeF_2$) after bonding to fully or partially etch the trenches within the backside of the chip/die. In these embodiments where the backside of the chip/die is etched after singulation/dicing from its parent semiconductor wafer, the aspect ratio (width:depth) of the trench etched into the backside of the chip/die is 1:1, or X:4, where X is any value of one or greater.

In some embodiments, the methods disclosed herein provide for fabrication of a bulk-Si or thin-BOX SOI wafer, with backside etched trenches, and with III-V material die bonded to the oxide at the bottom of the said trenches. Also, in some embodiments, the methods disclosed herein provide for fabrication of a laser structure formed by bonding a III-V material die on top of a grating (cavity structure) defined in poly-Si or body-Si of the bulk-Si or thin-BOX SOI wafer, where the III-V material die is placed on the shallow-trench oxide or thin-BOX at the bottom of the trench etched in the backside of the chip/die either before or after singulation/dicing of the chip/die from the wafer. In some of these embodiments, contacts of the III-V material die connect to the BITIE or substrate taps. In some of these embodiments, the III-V material die is an optical amplifier die with contacts connected to the BITIE or substrate taps.

In some embodiments, the methods of FIGS. 6A, 6B, 7A, and 7B include front-back aligned lithography on the backside of the wafer using exposed frontside features made visible through etched features formed in the backside of the wafer, such as the etched features formed through the methods of FIGS. 5A and 5B. In some embodiments, an aligned front-back camera system is used to image the backside of the wafer while aligned to the frontside of the wafer. In some embodiments, an infrared camera and light source is used to emit infrared wavelength light toward the backside of the wafer to image frontside wafer features through the backside of the wafer, e.g., through the silicon handle of the wafer. In some embodiments, the infrared camera is able to pick up optical wavelengths of at least 1100 nanometers. In some embodiments, the infrared camera has a filter to block out optical wavelengths below 1100 nanometers. In some embodiments, the infrared light source emits optical wavelengths of at least 1100 nanometers. In some embodiments, the infrared light source is an incandescent light source emitting a broad spectrum of wavelengths. In some embodiments, the infrared light source is an infrared laser configured to emit laser light at a wavelength of at least 1100 nanometers. In some embodiments, the front-back aligned lithography is performed using unexposed frontside features that are made visible through features etched into the backside of the wafer.

Figure 10:
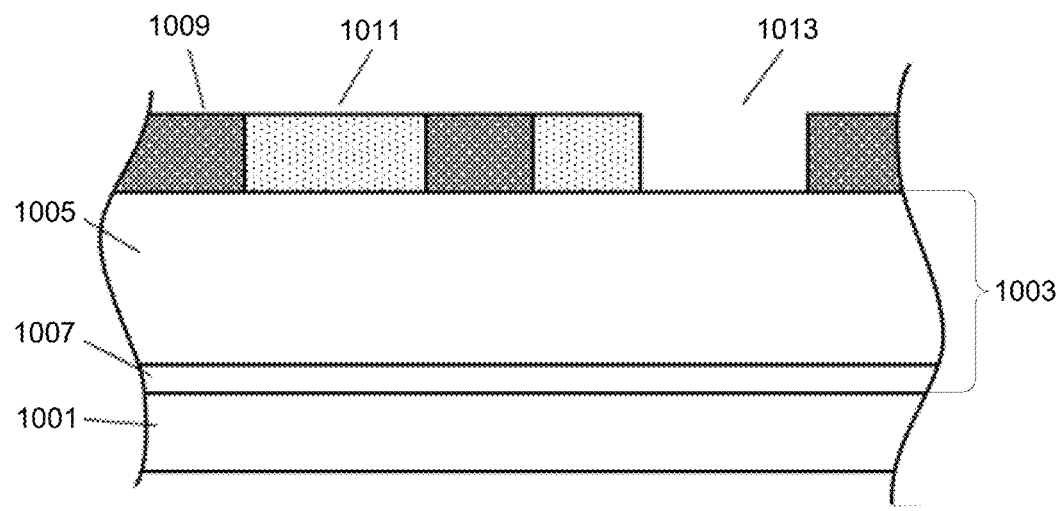
FIG. 10 shows an example cross-section through a die on a semiconductor wafer, in accordance with some embodiments of the present invention.

FIG. 10 shows an example cross-section through a die on a semiconductor wafer, in accordance with some embodiments of the present invention. The cross-section includes a wafer support system (WSS) 1001. In some embodiments, the WSS 1001 can be a film frame, e.g., dicing tape. In some embodiments, the WSS 1001 can be a wafer, e.g., glass or silicon wafer carrier. The cross-section includes a die 1003 disposed on the WSS 1001. The die 1003 includes a handle portion 1005 and an active portion 1007. The handle portion 1005 of the die 1003 can be the handle portion of an SOI wafer, or a portion of the substrate for a bulk silicon wafer. The active portion 1007 of the die 1003 includes transistors, interlevel dielectrics, interconnects (contacts, vias, and metallization lines), shallow trench isolation regions, etc., as normally found in semiconductor chips. For ease of description, the active portion 1007 of the die 1003 is shown as the start of the BOX for an SOI wafer, or as the start of the STI for a bulk silicon wafer. The handle portion 1005 of the die 1003 can be thinned through various processes such as grinding, polishing, chemical mechanical planarization/polishing, etching, among other processes. A typical thickness of the die 1003 is about 350 micrometers. However, the die 1003 can have essentially any thickness, up to and including the full wafer thickness. Greater process control is achievable with a thinner starting thickness of the die 1003. The cross-section of FIG. 10 also shows a photoresist pattern, including portions of unexposed photoresist 1009, portions of partially exposed photoresist 1011, and area(s) 1013 where the photoresist has been completely exposed and developed. In some embodiments, the area(s) 1013 where the photoresist has been completely exposed and developed are located wherever they are needed, such as over the kurf regions, among other locations.

Figure 11:
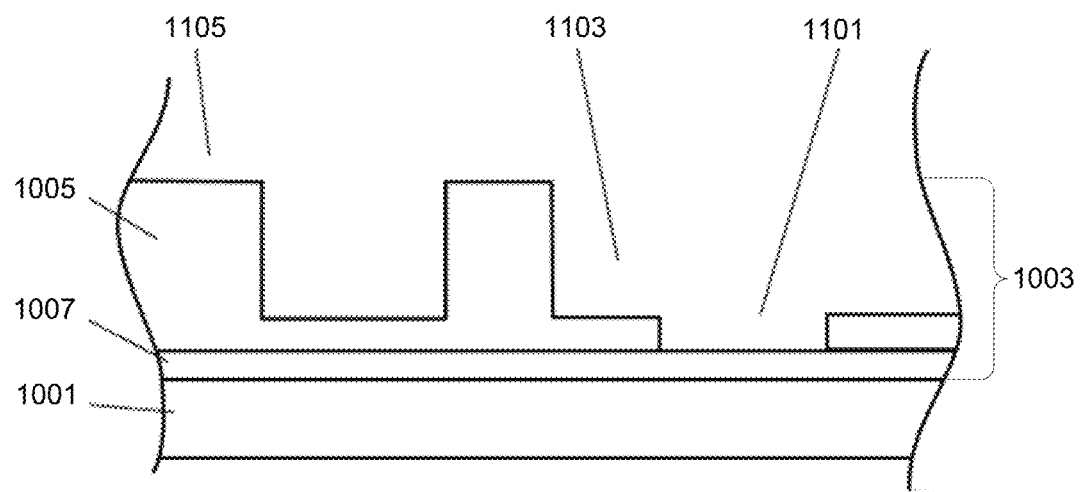
FIG. 11 shows the example cross-section of FIG. 10 after performing an etching process to remove portions of the handle portion of the die, in accordance with some embodiments of the present invention.

FIG. 11 shows the example cross-section of FIG. 10 after performing an etching process to remove portions of the handle portion 1005 of the die 1003, in accordance with some embodiments of the present invention. FIG. 11 shows a fully etched region 1101. In some embodiments, the fully etched region 1101 is etched down to an etch stop material, such as an oxide material or a nitride material. In some embodiments, the BOX or STI materials in the die serve as an etch stop material. In various embodiments, etching through the handle portion 1005 of the die 1003 can be done using a timed etch or by monitoring effluents, i.e., etch byproduct materials, to identify the presence of a particular byproduct material that indicates when the etch has reached a prescribed depth. In various embodiments, the handle portion 1005 of the die 1003 can be etched using standard reactive ion etching processes and/or dry etching processes. In some embodiments, etching of the handle portion 1005 of the die 1003 is done in an anisotropic manner to improve results, such as by applying bias power to direct the etch front in a more downward direction through the handle portion 1005. In some embodiments, features/regions etched through the handle portion 1005 of the die 1003 can have aspect ratios of up to 10:1 (depth:width), or even higher, such as up to or greater than 50:1 (depth:width). In some embodiments, so-called plasma dicing technology can achieve line/space minimums of 4 micrometers for full thickness wafer etches. In various embodiments, anisotropic silicon etching can be done using $SF_6$, $NF_3$, or $CF_4$, among other materials. It should be understood that in various embodiments essentially any type of etching process and etching material can be used that is suitable for etching the particular material of which the handle portion 1005 of the die 1003 is formed. Also, in some embodiments, full thickness etching can include kurf etching, such that the plasma dicing process can be incorporated into the etching of the handle portion 1005 of the die 1003.

FIG. 11 also shows a partially etched region 1103. In some 3D (three-dimensional) chip stacking processes, die are stacked with individual thicknesses of only about 50 micrometers. In some embodiments, these die can be thermal-compression bonded (TCB) to substrates and/or other die without die breakage. Therefore, in some embodiments, a region of the handle portion 1005 having a thickness of about 50 micrometers can be left to allow for flip-chip and TCB of the die onto a substrate. FIG. 11 also shows a thicker region 1105 of the handle portion 1005 remaining, relative to the partially etched region 1103. In some embodiments, the thicker region 1105 of the handle portion 1005 can be essentially unetched. In some embodiments, the thicker region 1105 of the handle portion 1005 can be etched by some amount, especially if the photoresist material is completely etched away during the etching process. Etching of some of the thicker region 1105 of the handle portion 1005 can be acceptable if there is a difference in height between the thicker region 1105 and the partially etched region 1103. In some embodiments, the height difference between the thicker region 1105 and the partially etched region 1103 should be greater than a designed isotropic etch thickness.

Figure 12:
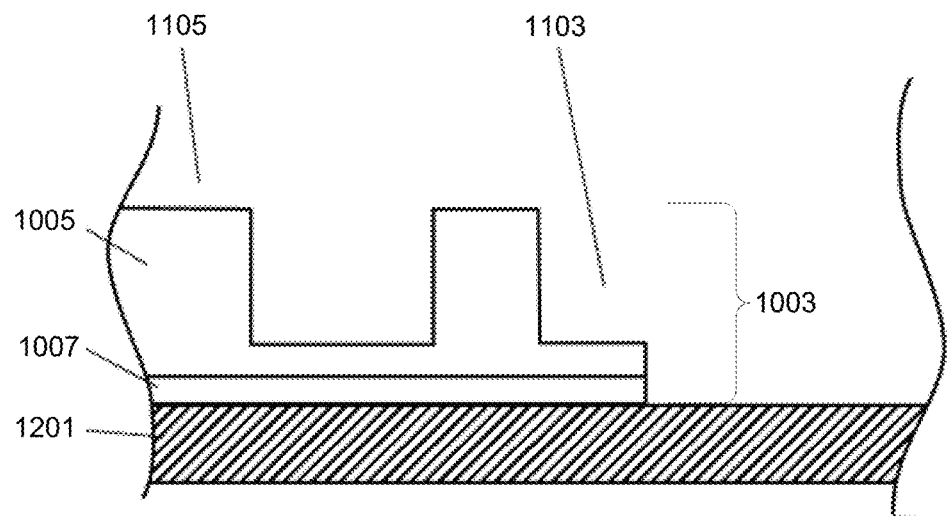
FIG. 12 shows the example cross-section of FIG. 11 after performing a flip-chip process, in accordance with some embodiments of the present invention.

FIG. 12 shows the example cross-section of FIG. 11 after performing a flip-chip process, in accordance with some embodiments of the present invention. The cross-section shows a package substrate 1201, i.e., an electronic package substrate. In various embodiments, the package substrate 1201 can be a silicon interposer, a Bismaleimide-Triazine resin based build-up structure, a low temperature co-fired ceramic, glass, or some other suitable type of structure. FIG. 12 shows the die 1003 flip-chip bonded to the package substrate 1201. It should be understood that in various embodiments the flip-chip bonding of the die 1003 to the package substrate 1201 can include disposition of a ball grid array (BGA), bumps, solder, under-fill, and/or other component(s), between the die 1003 and the package substrate 1201. In the interest of clarity, such components that may be present between the die 1003 and the package substrate 1201 are not shown in FIG. 12. Also, it should be understood that essentially any known technique for flip-chip bonding of a die to a package substrate (such as mass reflow, TCB, or other technique) can be used to achieve the configuration depicted in FIG. 12.

Figure 13:
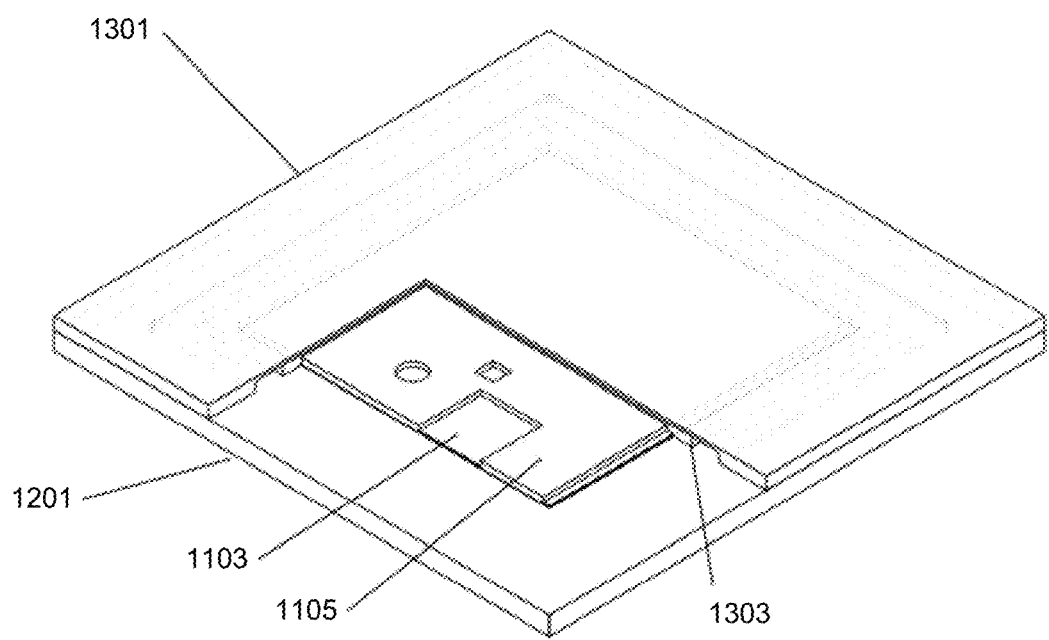
FIG. 13 shows an isometric view of a pre-isotropic-etched package configuration corresponding to the example cross-section of FIG. 12, in accordance with some embodiments of the present invention.

FIG. 13 shows an isometric view of a pre-isotropic-etched package configuration corresponding to the example cross-section of FIG. 12, in accordance with some embodiments of the present invention. FIG. 13 shows a lid 1301 and a thermal-interface material (TIM) 1303. In various embodiments, the lid can be made from aluminum, Alloy 42, copper, among suitable materials. The lid 1301 can also be plated, such as to provide solderability. In some embodiments, the lid 1301 can be formed as "glob top" epoxy, or by any other known approach for protecting the die 1003. In various embodiments, the TIM 1303 can be formed of thermal grease, epoxy, solder (such as Indium, among others), potting compound, by essentially any other suitable material. In some embodiments, the TIM 1303 can serve as a hard mask for an isotropic etch. In these embodiments, the TIM 1303 can be hermetic in the sense that the TIM 1303 seals around the portions of the die 1003 that should not be etched. Also, in these embodiments, the TIM 1303 can be a low-outgassing material, which may be of particular benefit if the isotropic etch is done in a vacuum. It should be understood that the pre-isotropic-etched package configuration of FIG. 13 can also include other components (such a BGA, PGA, or LGA connections, underfill, and/or other common package components) which are not shown in order to preserve clarity. Also, it should be understood that the shapes depicted for the regions 1103 and 1105, and of the package substrate 1201, and of the lid 1301, and of the TIM 1303 are provided by way of example. In various embodiments, the shapes of the regions 1103 and 1105, and of the package substrate 1201, and of the lid 1301, and of the TIM 1303 can be configured in any manner as needed.

Figure 14:
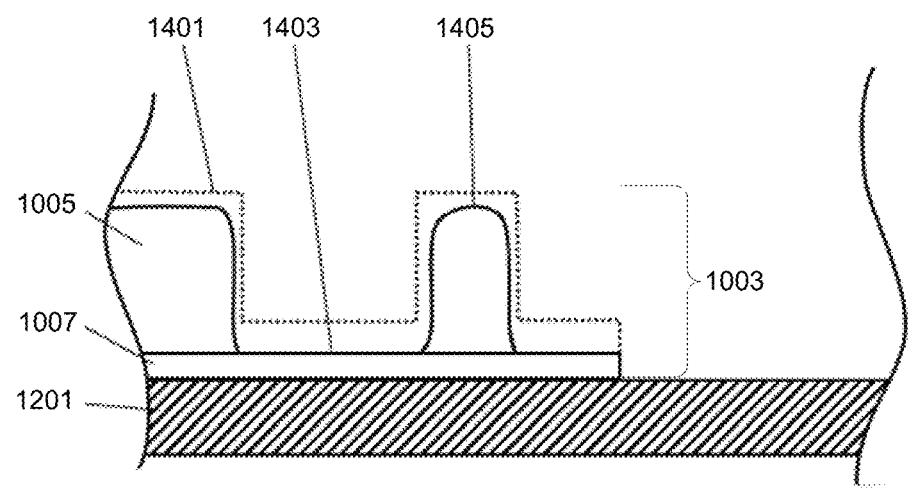
FIG. 14 shows an example cross-section of the package configuration of FIG. 13 after performing an isotropic etch process, in accordance with some embodiments of the present invention.

FIG. 14 shows an example cross-section of the package configuration of FIG. 13 after performing an isotropic etch process, in accordance with some embodiments of the present invention. The handle portion 1005 of the die 1003 (of the SOI wafer or bulk silicon wafer) is etched isotropically, i.e., on all surfaces, at the package level. A line 1401 indicates the surface of the handle portion 1005 before the isotropic etch. Comparison of the line 1401 to the surface of the remaining handle portion 1005 shows the isotropic nature of the etch in both the vertical and lateral directions, as well as in all directions between vertical and lateral. Comparison of the line 1401 to the surface of the remaining handle portion 1005 also shows that the partially etched region 1103 of the handle portion 1005 has been completely removed by the isotropic etch at the package level, as shown at location 1403 in FIG. 14. Also, a region 1405 of the handle portion 1005 shows how a portion of the handle portion 1005 was not etched at the wafer level, but was later etched at the package level. In various embodiments, features such as the region 1405 that are not etched at the wafer level but are later etched at the package level can be formed to create optical fiber alignment structures, and/or regions designed to strengthen the die 1003 (such as gusset regions).

Figure 15:
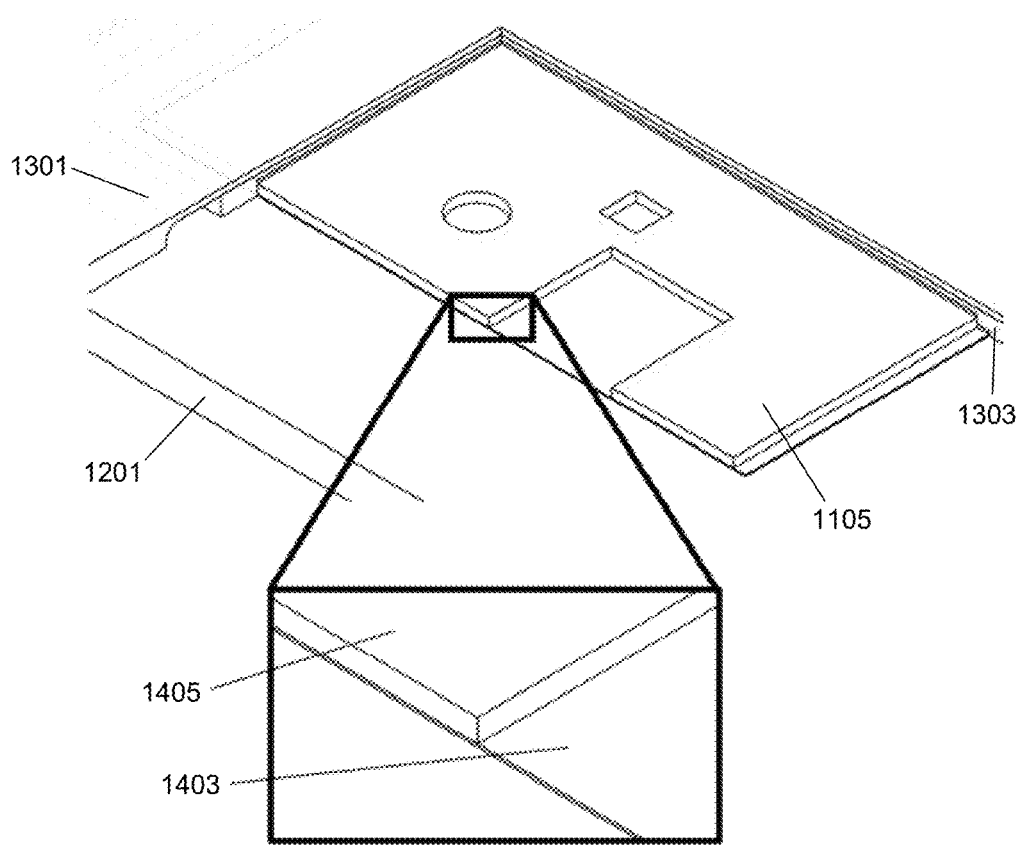
FIG. 15 shows an isometric view of a post-isotropic-etched package configuration corresponding to the example cross-section of FIG. 14, in accordance with some embodiments of the present invention.

FIG. 15 shows an isometric view of a post-isotropic-etched package configuration corresponding to the example cross-section of FIG. 14, in accordance with some embodiments of the present invention. In the isotropic etching process, the TIM 1303 acts as a hard mask. Regions protected by the TIM 1303 remain unetched. However, exposed regions not protected by the TIM 1303 are etched. In various embodiments, essentially any isotropic etch can be used. In some embodiments, the isotropic etch is done using $XeF_2$ as an etchant material, which has high selectivity to aluminum (and other metals) and $Al_2O_3$. In various embodiments, LTCC materials are mostly $Al_2O_3$, and the lid 1301 is usually metal. In some embodiments, placement accuracy of the lid 1301 is not stringent, thereby allowing for use of typical pick-and-place tools to apply the lid 1301. It should be understood that the fine resolution features are defined by the anisotropic etch. Also, it should be appreciated that by etching the handle portion 1005 of the die 1003 at the package level, the risk of shattering the die 1003 is significantly reduced. For example, by etching the handle portion 1005 of the die 1003 at the package level after completion of the flip-chip process, the risk of shattering the die 1003 during the flip-chip process is significantly reduced.

It should be understood that the methods disclosed herein can be embodied as instructions for controlling various types of semiconductor fabrication equipment, and these instructions can be stored as computer readable code on a computer readable medium. The computer readable medium can be any data storage device that can store data which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices, among others. In some embodiments, the computer readable medium can be distributed over a network of coupled computer systems so that the computer readable code is stored and executed in a distributed fashion.

Any of the operations described herein that form part of the invention are useful machine operations. The invention also relates to a device or an apparatus for performing these operations. The apparatus may be specially constructed for the required purpose, such as a special purpose computer and/or a type of semiconductor fabrication equipment programmed/controlled to perform operations of the method disclosed herein. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

The embodiments of the present invention can also be defined as a machine that transforms data from one state to another state. The data may represent an article, that can be represented as an electronic signal and electronically manipulate data. The transformed data can, in some cases, be visually depicted on a display, representing the physical object that results from the transformation of data. The transformed data can be saved to storage generally, or in particular formats that enable the construction or depiction of a physical and tangible object. In some embodiments, the manipulation can be performed by a processor. In such an example, the processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

It should be further understood that the methods disclosed herein can be used to manufacture part of a semiconductor device or chip. In the fabrication of semiconductor devices such as integrated circuits, memory cells, and the like, a series of manufacturing operations are performed to define features on a semiconductor wafer. The wafer includes integrated circuit devices in the form of multi-level structures defined on a substrate, such as a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. A method for processing a backside of a semiconductor chip, comprising:
    having a semiconductor wafer that has a frontside and a backside, the semiconductor wafer including a substrate and a number of semiconductor chips, each of the number of semiconductor chips including a respective portion of the substrate, wherein the backside of the semiconductor wafer is a bottom surface of the substrate, wherein each of the number of semiconductor chips occupies a respective area of the semiconductor wafer and is ready for singulation from the semiconductor wafer;
    applying a photoresist material to the backside of the semiconductor wafer;
    exposing particular regions of the backside of the semiconductor wafer through the photoresist material, the particular regions collectively including a portion of a backside of each of the semiconductor chips;
    etching the backside of the semiconductor wafer at the particular regions with the semiconductor wafer in an intact state to respectively form an etched region in the backside of each of the semiconductor chips, the etched region of each semiconductor chip formed to provide a location for attachment of an optical component; and
    attaching a III-V material die within the etched region of at least one of the semiconductor chips.

2. The method as recited in claim 1, further comprising:
    removing the photoresist material from the backside of the semiconductor wafer.

3. The method as recited in claim 1, further comprising:
    singulating the semiconductor wafer to obtain the semiconductor chips in individual form.

4. The method as recited in claim 1, wherein the etched region includes one or more optical fiber alignment structures.

5. The method as recited in claim 4, further comprising:
    securing one or more optical fibers within the one or more optical fiber alignment structures of the etched region.

6. The method as recited in claim 1, further comprising:
    positioning an optical waveguide within the etched region before attaching the III-V material die within the etched region.

7. The method as recited in claim 1, wherein the etched region of any given semiconductor chip is a hole formed through the backside of the given semiconductor chip to a prescribed depth within an overall thickness of the given semiconductor chip.

8. The method as recited in claim 7, wherein the prescribed depth corresponds to an etch stop material present within the given semiconductor chip.

9. The method as recited in claim 8, wherein the etch stop material is an oxide layer.

10. The method as recited in claim 1, wherein each of the particular regions is located inside of the respective area occupied by a corresponding one of the semiconductor chips.

11. The method as recited in claim 10, further comprising:
    exposing additional regions of the backside of the semiconductor wafer through the photoresist material, wherein the additional regions include chip kerf regions that define boundaries of the semiconductor chips; and
    etching the backside of the semiconductor wafer at the additional regions in conjunction with etching the backside of the semiconductor wafer at the particular regions.

12. The method as recited in claim 1, wherein exposing particular regions of the backside of the semiconductor wafer through the photoresist material includes aligning the semiconductor wafer by optical detection of optically detectable features present within the semiconductor wafer, wherein the optical detection is done by looking toward the backside of the semiconductor wafer.

13. The method as recited in claim 12, wherein the optical detection of optically detectable features includes viewing the optically detectable features through holes etched within the substrate, or
    wherein optical detection of optically detectable features includes illuminating the backside of the semiconductor wafer with an infrared light source and viewing infrared light reflected from the optically detectable features using an infrared camera.

14. A method for processing a backside of a semiconductor chip, comprising:
    having a semiconductor wafer that has a frontside and a backside, the semiconductor wafer including a substrate and a number of semiconductor chips, each of the number of semiconductor chips including a respective portion of the substrate, wherein the backside of the semiconductor wafer is a bottom surface of the substrate, wherein each of the number of semiconductor chips occupies a respective area of the semiconductor wafer and is ready for singulation from the semiconductor wafer;
    applying a photoresist material to the backside of the semiconductor wafer;
    exposing separate regions of the backside of the semiconductor wafer through the photoresist material, wherein each of the separate regions extends across at least a portion of a backside of at least one of the number of semiconductor chips and a chip kerf region next to the portion of the backside of the at least one of the number of semiconductor chips, wherein at least one of the separate regions extends continuously across a portion of a backside of a first one of the number of semiconductor chips and a portion of a backside of a second one of the number of semiconductor chips and a chip kerf region located between the portions of the backsides of the first and second ones of the number of semiconductor chips;
    etching the backside of the semiconductor wafer at the separate regions with the semiconductor wafer in an intact state to respectively form an etched region in the backside of each of the semiconductor chips, the etched region of each semiconductor chip formed to provide a location for attachment of an optical component; and
    attaching an optical component within the etched region of at least one of the semiconductor chips.

15. The method as recited in claim 14, further comprising:
    exposing additional regions of the backside of the semiconductor wafer through the photoresist material, wherein the additional regions include chip kerf regions that define boundaries of the semiconductor chips; and
    etching the backside of the semiconductor wafer at the additional regions in conjunction with etching the backside of the semiconductor wafer at the separate regions.

16. The method as recited in claim 14, further comprising:
    removing the photoresist material from the backside of the semiconductor wafer.

17. The method as recited in claim 14, further comprising:
    singulating the semiconductor wafer to obtain the semiconductor chips in individual form.

18. The method as recited in claim 14, wherein the etched region includes one or more optical fiber alignment structures.

19. The method as recited in claim 14, wherein the optical component is a III-V material die.

20. The method as recited in claim 19, further comprising:
positioning an optical waveguide within the etched region before attaching the optical component within the etched region.

21. The method as recited in claim 14, wherein the etched region of any given semiconductor chip extends to a prescribed depth within an overall thickness of the given semiconductor chip.

22. The method as recited in claim 21, wherein the prescribed depth corresponds to an etch stop material present within the given semiconductor chip.

23. The method as recited in claim 22, wherein the etch stop material is an oxide layer.

24. The method as recited in claim 14, wherein exposing the separate regions of the backside of the semiconductor wafer through the photoresist material includes aligning the semiconductor wafer by optical detection of optically detectable features present within the semiconductor wafer from the backside of the semiconductor wafer.

25. The method as recited in claim 24, wherein the optical detection of optically detectable features includes viewing the optically detectable features through holes etched within the substrate, or
wherein optical detection of optically detectable features includes illuminating the backside of the semiconductor wafer with an infrared light source and viewing infrared light reflected from the optically detectable features using an infrared camera, or
wherein optical detection of optically detectable features includes viewing the optically detectable features through a camera positioned to view a frontside of the semiconductor wafer.

26. A method for processing a backside of a semiconductor chip, comprising:
having a semiconductor wafer that includes a plurality of semiconductor chips and that has a frontside and a backside, wherein the backside of the semiconductor wafer is a bottom surface of a substrate of the semiconductor wafer;
applying a photoresist material to the backside of the semiconductor wafer;
exposing particular regions of the backside of the semiconductor wafer through the photoresist material, the particular regions collectively including a portion of a backside of each of the plurality of semiconductor chips;
singulating the semiconductor wafer to obtain the plurality of semiconductor chips in individual form;
etching the backside of each of the plurality of semiconductor chips in individual form at the particular regions, such that the backside of each of the plurality of semiconductor chips includes an etched region corresponding to at least a portion of at least one of the particular regions; and
removing the photoresist material from the backside of the plurality of semiconductor chips in individual form.

27. The method as recited in claim 26, further comprising:
attaching an optical component within the etched region within the backside of at least one of the plurality of semiconductor chips.

28. The method as recited in claim 27, wherein the particular regions include one or more areas on the backside of each of the plurality of semiconductor chips, each of the one or more areas including one or more optical fiber alignment structures.

29. The method as recited in claim 28, further comprising:
securing one or more optical fibers within the one or more optical fiber alignment structures.

30. The method as recited in claim 27, wherein the optical component is a III-V material die.

31. The method as recited in claim 30, further comprising:
positioning an optical waveguide within the etched region before attaching the optical component within the etched region.

32. The method as recited in claim 26, wherein the etched region within a particular semiconductor chip of the plurality of semiconductor chips is a hole formed through the backside of the particular semiconductor chip to a prescribed depth within an overall thickness of the particular semiconductor chip.

33. The method as recited in claim 32, wherein the prescribed depth corresponds to an etch stop material present within the given semiconductor wafer.

34. The method as recited in claim 33, wherein the etch stop material is an oxide layer.

35. The method as recited in claim 26, wherein exposing particular regions of the backside of the semiconductor wafer through the photoresist material includes aligning the semiconductor wafer by optical detection of optically detectable features present within the semiconductor wafer from the backside of the semiconductor wafer, wherein each of the optically detectable features is located within an overall thickness of the semiconductor wafer at a corresponding location between the top surface of the substrate and the frontside of the semiconductor wafer.

36. The method as recited in claim 35, wherein the optical detection of optically detectable features includes viewing the optically detectable features through holes etched within the substrate, or
wherein optical detection of optically detectable features includes illuminating the backside of the semiconductor wafer with an infrared light source and viewing infrared light reflected from the optically detectable features using an infrared camera, or
wherein optical detection of optically detectable features includes viewing the optically detectable features through a camera positioned to view a frontside of the semiconductor wafer.

37. A method for processing a backside of a semiconductor chip, comprising:
having a semiconductor wafer that has a frontside and a backside, the semiconductor wafer including a substrate and a number of semiconductor chips, each of the number of semiconductor chips including a respective portion of the substrate, wherein the backside of the semiconductor wafer is a bottom surface of the substrate, wherein each of the number of semiconductor chips occupies a respective area of the semiconductor wafer and is ready for singulation from the semiconductor wafer;
applying a photoresist material to the backside of the semiconductor wafer;
aligning the semiconductor wafer by optical detection of optically detectable features present within the semiconductor wafer, wherein the optical detection is done by looking toward the backside of the semiconductor wafer;
exposing particular regions of the backside of the semiconductor wafer through the photoresist material, the particular regions collectively including a portion of a backside of each of the semiconductor chips;

etching the backside of the semiconductor wafer at the particular regions with the semiconductor wafer in an intact state to respectively form an etched region in the backside of each of the semiconductor chips, the etched region of each semiconductor chip formed to provide a location for attachment of an electro-optical device; and attaching the electro-optical device within the etched region of at least one of the semiconductor chips.

38. The method as recited in claim 37, wherein the optical detection of optically detectable features includes viewing the optically detectable features through holes etched within the substrate, or wherein optical detection of optically detectable features includes illuminating the backside of the semiconductor wafer with an infrared light source and viewing infrared light reflected from the optically detectable features using an infrared camera.

39. The method as recited in claim 37, further comprising: removing the photoresist material from the backside of the semiconductor wafer.

40. The method as recited in claim 37, further comprising: singulating the semiconductor wafer to obtain the semiconductor chips in individual form.

41. The method as recited in claim 37, wherein the etched region includes one or more optical fiber alignment structures.

42. The method as recited in claim 37, further comprising: positioning an optical waveguide within the etched region.

43. The method as recited in claim 42, wherein the electro-optical device is a III-V material die.

44. The method as recited in claim 37, wherein the etched region of any given semiconductor chip extends to a prescribed depth within an overall thickness of the given semiconductor chip.

45. The method as recited in claim 44, wherein the prescribed depth corresponds to an etch stop material present within the given semiconductor chip.

46. The method as recited in claim 45, wherein the etch stop material is an oxide layer.

47. The method as recited in claim 37, wherein the electro-optical device is placed over a grating structure formed within the at least one of the semiconductor chips.

48. The method as recited in claim 37, wherein electrical contacts of the electro-optical device are electrically connected to one or more interconnect layers within the at least one of the semiconductor chips.

* * * * *